US007018494B2

(12) United States Patent
Suzuki et al.

(10) Patent No.: US 7,018,494 B2
(45) Date of Patent: Mar. 28, 2006

(54) METHOD OF PRODUCING A COMPOSITE SHEET AND METHOD OF PRODUCING A LAMINATE BY USING THE COMPOSITE SHEET

(75) Inventors: Shinichi Suzuki, Osaka (JP); Koichi Nagata, Osaka (JP); Takayuki Ikeuchi, Osaka (JP); Yuji Tanaka, Osaka (JP); Yasuhiro Sasaki, Kokubu (JP); Shigeki Yamada, Kokubu (JP); Yasuhiko Yoshihara, Kokubu (JP); Masamitsu Onitani, Kokubu (JP)

(73) Assignee: Kyocera Corporation, Kyoto (JP)

( * ) Notice: Subject to any disclaimer, the term of this patent is extended or adjusted under 35 U.S.C. 154(b) by 21 days.

(21) Appl. No.: 10/652,890

(22) Filed: Aug. 28, 2003

(65) Prior Publication Data

US 2004/0099364 A1 May 27, 2004

(30) Foreign Application Priority Data

| Aug. 28, 2002 | (JP) | ............................. 2002-249801 |
| Aug. 28, 2002 | (JP) | ............................. 2002-249802 |
| Oct. 29, 2002 | (JP) | ............................. 2002-314958 |
| Apr. 24, 2003 | (JP) | ............................. 2003-120797 |
| Apr. 24, 2003 | (JP) | ............................. 2003-120799 |

(51) Int. Cl.
  *B32B 31/18* (2006.01)
  *B32B 31/24* (2006.01)
  *B28B 3/00* (2006.01)
(52) U.S. Cl. .................... 156/89.11; 156/252; 156/253; 156/261; 156/293; 29/851
(58) Field of Classification Search ............. 156/89.11, 156/89.12, 89.16, 89.23, 252, 253, 261, 293; 264/610; 29/851
See application file for complete search history.

(56) References Cited

U.S. PATENT DOCUMENTS 3,768,144 A * 10/1973 Heinss ...................... 29/432

(Continued)

FOREIGN PATENT DOCUMENTS

JP 5-21635 1/1993

(Continued)

OTHER PUBLICATIONS

"Filling Vias in Ceramic Green Sheets," IBM Technical Disclosure Bulletin, Jan. 1990, vol. 32, Issue 8B, pp. 43-44.*

*Primary Examiner*—Melvin Mayes
(74) *Attorney, Agent, or Firm*—Hogan & Hartson, L.L.P.

(57) ABSTRACT

A method of producing a composite sheet in which a through hole formed in a predetermined portion of the first ceramic sheet is buried with a different kind of sheet having substantially the same thickness as the first ceramic sheet, such as a resin sheet a metal sheet or a ceramic sheet of a material different from that of the first ceramic sheet. A first method comprises a step of preparing a first ceramic sheet from a ceramic powder, and a different kind of sheet; a step of forming a through hole in a predetermined portion of the first ceramic sheet; a step of laminating the different kind of sheet on the ceramic sheet in which the through hole is formed; and a step of preparing a composite sheet by pressing the portion of the first ceramic sheet where the through hole is formed from the side of the different kind of sheet, such that the first ceramic sheet and the different kind of sheet are integrated together. A second method comprises a step of preparing a first ceramic sheet and a different kind of sheet, and laminating the first ceramic sheet and the different kind of sheet one upon the other; and a step of preparing a composite sheet by pressing a predetermined portion of the laminate from the side of the different kind of sheet, such that the pressed portion of the different kind of sheet is transferred onto the side of the first ceramic sheet to integrate the first ceramic sheet and the different kind of sheet together. A further method is for producing a laminate by laminating the obtained composite sheet on other first ceramic sheet or on other composite sheet.

12 Claims, 8 Drawing Sheets

U.S. PATENT DOCUMENTS

| | | | |
|---|---|---|---|
| 4,920,640 A * | 5/1990 | Enloe et al. | 29/852 |
| 5,239,744 A * | 8/1993 | Fleming et al. | 29/602.1 |
| 5,305,523 A * | 4/1994 | Bross et al. | 29/832 |
| 5,603,147 A * | 2/1997 | Bischoff et al. | 29/25.42 |
| 5,656,113 A * | 8/1997 | Ikeda et al. | 156/89.15 |
| 6,200,400 B1 * | 3/2001 | Farooq et al. | 156/89.16 |
| 6,231,707 B1 * | 5/2001 | Gupta et al. | 156/89.12 |
| 6,569,278 B1 * | 5/2003 | Gabriels et al. | 156/261 |

FOREIGN PATENT DOCUMENTS

| | | | |
|---|---|---|---|
| JP | 05-069394 | * | 3/1993 |
| JP | 07-221446 | * | 8/1995 |
| JP | 08-236931 | * | 9/1996 |
| JP | 11-97854 | | 4/1999 |
| JP | 2002-185147 | | 6/2002 |
| JP | 2002-290053 | | 10/2002 |

* cited by examiner

METHOD OF PRODUCING A COMPOSITE SHEET AND METHOD OF PRODUCING A LAMINATE BY USING THE COMPOSITE SHEET

BACKGROUND OF THE INVENTION

1. Field of the Invention

The present invention relates to a method of producing a composite sheet including a ceramic layer and to a method of producing a laminate by using the composite sheet. More particularly, the invention relates to a method of producing a composite sheet that is preferably used for the production of a variety of wiring boards and a wiring board applied to packages for containing semiconductor devices, and is particularly used for the production of ceramic boards having wiring conductors capable of radiating the heat and permitting the flow of heavy currents of power module boards. The invention further relates to a method of producing a laminate such as a wiring board using the composite sheet.

2. Description of the Related Art

In recent years, the semiconductor devices are generating the heat in ever increased amounts accompanying the trend toward highly densely integrating the semiconductor devices.

In order to prevent the semiconductor devices from erroneously operating, it is necessary to use a wiring board which is capable of radiating the heat out of the device.

As for the electrical characteristics, further, a delay in the signals causes a problem as the operation speed increases, and it has been desired to use a wiring conductor having a small wiring conductor loss, i.e., to use a wiring conductor having a low resistance.

As for the wiring board mounting the semiconductor devices, there has been much used a ceramic wiring board using alumina ceramics as an insulating board and depositing a wiring layer of a high-melting metal such as tungsten or molybdenum on the surfaces thereof or in the interior thereof from the standpoint of reliability.

With the wiring layer of a high-melting metal that has heretofore been much used, however, the resistance can be decreased down to about 13 $\mu\Omega \cdot cm$ at the greatest.

In order to flow a large current by lowering the resistance of the wiring conductor in the multi-layer wiring board, therefore, it has been attempted to form a thick film of copper (Cu) or a wiring conductor by non-electrolytic plating on the insulating board that constitutes the multi-layer wiring board.

In the wiring conductor in which the wirings are densely arranged, however, the wire width of the wiring pattern is limited by the area of the multi-layer wiring board and cannot be increased beyond a predetermined width. Besides, with the above method of forming the wiring conductor, it is difficult to obtain a wiring conductor having a sufficient thickness at a low cost within short periods of time without adversely affecting the subsequent steps. Therefore, the above requirement of decreasing the resistance is not satisfied.

In order to flow a large current by lowering the resistance of the wiring conductor, therefore, there have been proposed low-resistance wiring conductors in which through holes are formed in a ceramic green sheet that constitutes the multi-layer wiring board, and the through holes are thickly filled with a wiring conductor paste comprising a low-melting metal having a low electric resistance, such as copper (Cu) or silver (Ag)(see for, for example, Japanese Unexamined Patent Publications (Kokai) Nos. 5-21635 and 63-194).

When the above low-resistance wiring conductor is to be formed, through holes are formed in a predetermined ceramic green sheet, and recessed portions formed by laminating another green sheet are filled with metal paste for wiring by a screen-printing method or a dispenser method.

After the paste has been filled, the drying is effected. At this moment, the surfaces of the portions filled with the paste become rugged such as dented. When a green sheet is laminated, therefore, the laminate becomes defective or is deformed.

In forming complex patterns, further, the paste is poorly filled to cause defective connection to other circuits.

Further, a wiring board of a structure having a gap therein for accommodating an electronic part such as LSI as represented by a substrate for packaging the semiconductor device, has so far been produced by a method that is described below.

Namely, a suitable organic binder is added to a starting ceramic powder prepared at a predetermined ratio, which is, then, dispersed in an organic solvent to prepare a slurry thereof. Then, a ceramic green sheet of a predetermined thickness is formed by a casting method such as doctor blade method or lip coater method. A metal paste obtained by adding an organic binder, a solvent and a plasticizer to a suitable metal powder, is, then, printed and applied on the green sheet in a predetermined wiring pattern by the screen-printing method. Then, through holes are formed by using a micro-drill or a laser beam. The through holes are then filled with a metal paste to form via conductors.

Then, in order to form a cavity for accommodating an electronic part, a through hole is pierced by punching at a predetermined portion of the green sheet.

Then, as shown in FIG. 9(a) which is a view illustrating a conventional step, a plurality of green sheets, i.e., green sheets 21a and 21b in which the through holes 20 are formed are laminated together with other green sheets 21c, 21d and 21e using a suitable adhering solution, and the thus obtained ceramic laminate molded article is fired under predetermined conditions to obtain a board 23 having a cavity 22 for accommodating an electronic part as shown in FIG. 9(b).

In this ceramic board 23, the wiring patterns and via holes must be finely formed from the standpoint of fabricating the substrate in a small size, and it is indispensable to improve precision at the time of lamination.

In the substrate having the cavity 22, however, the pressure fluctuates between the cavity 22 and other portions at the time of laminating the green sheets 21a, 21b having the through hole 20 for constituting the cavity 22 on other green sheets 21c, 21d, 21e, and deformation takes place at the time of lamination. If the pressure is decreased to prevent the deformation, then, the adhesion becomes defective among the green sheets.

The deformation referred to here includes, as shown in FIG. 9, deformation in the horizontal direction that occurs in the green sheets 21a and 21b near the cavity 22 due to pressure in the vertical direction exerted on the laminate of the green sheets 21a to 21e, and deformation resulting from the swollen bottom of the cavity 22 in the green sheet 21c.

Of them, the swollen bottom of the cavity 22 causes defective bonding when the electronic part such as LSI chip is to be mounted. The swelling of the bottom of the cavity 22 can be decreased by lowering the pressure exerted on the laminate arousing, however, such a problem that the layers are peeled (delamination occurs) as designated at 24 in the periphery of the cavity 22. Further, accompanying the widespread use of portable terminals, in recent years, it has been urged to transmit signals at increasing speeds and at higher frequencies, and to transmit the data in large amounts, while decreasing the sizes, decreasing the background noise level, and decreasing the weight.

As for the parts that are to be mounted, therefore, it has been desired to provide a low-loss material that can cope with high-frequency signals and a wiring substrate using a low-loss conductor.

As a requirement for decreasing the size, further, the parts to be mounted have been fabricated in a modular form, and it has been desired to provide a wiring board fulfilling higher functions.

Among such requirements for fulfilling high functions, it is a modern trend to use such a wiring board as LTCC board made of a material of a low dielectric constant and using a low-loss conductor such as copper or silver, or a board using an organic material, making it possible to incorporate a capacitor by using a paste for enhancing the function and being compounded with a layer of a high dielectric constant and with a layer of a low dielectric constant.

When, for example, the dielectric constant is lowered in a portion of the multi-layer wiring board or a capacitor is formed in order to lower the transmission loss of a portion that corresponds to high-frequency signals, it has been proposed to decrease or increase the dielectric constant of the sheet of a corresponding portion among the plurality of sheets that are laminated (see, for example, Japanese Unexamined Patent Publications (Kokai) Nos. 2002-185147 and 2002-290053).

There has further been proposed to form a portion of a low dielectric constant in a sheet by forming a recessed portion at a predetermined portion of the sheet and filling the recessed portion with a ceramic past of a low dielectric constant or a high dielectric constant (see, for example, Japanese Unexamined Patent Publication (Kokai) No. 11-97854).

According to the method of laminating different ceramic green sheets, however, the dielectric constant is decreased or increased even up to those portions which are not desired, and limitation is imposed on designing the circuit.

According to the method of filling the recessed portions with the ceramic paste, further, the ceramic paste contains a solvent or the like. After the paste is dried, therefore, a step tends to occur between the surface of the ceramic green sheet and the surface of the paste that is filled. When a multi-layer structure is realized, therefore, defects tend to occur in the laminate.

Further, the portions filled with the ceramic paste and the ceramic green sheet have different molding densities, and it is difficult to equalize the contraction factors at the time of firing. As a result, gaps often develop in the junction portions.

SUMMARY OF THE INVENTION

It is therefore an object of the present invention to provide a method of producing a composite sheet in which another material is uniformly buried in a portion of a first ceramic sheet while preventing the occurrence of defect in the lamination and defective connection, as well as a method of producing a composite laminate by using the composite sheet.

It is further an object of the present invention to provide a method of producing a composite sheet that is suitably used for the production of a ceramic board having the cavity and a method of producing a composite laminate by using the composite sheet.

It is further an object of the present invention to provide a method of producing a composite sheet in which through holes are uniformly filled with a metal component while overcoming the problems inherent in the prior art of when the through holes are filled with a metal paste, and a method of producing a composite laminate by using the composite sheet.

It is further an object of the present invention to provide a method of producing a composite sheet in which another ceramic material is uniformly buried in a portion of a first sheet by substituting a predetermined ceramic material for the required portions only, featuring a flat surface and preventing the occurrence of defect in the lamination and defective connection, and a method of producing a composite laminate by using the composite sheet.

A first invention is concerned with a method of producing a composite sheet, comprising:

a step of preparing a first ceramic sheet from a ceramic powder, and a different kind of sheet made of a material different from that of the first ceramic sheet, both of said sheets having substantially the same thickness;

a step of forming a through hole in a predetermined portion of said first ceramic sheet;

a step of laminating said different kind of sheet on said first ceramic sheet in which said through hole is formed; and a step of preparing a composite sheet by pressing the portion of the first ceramic sheet where the through hole is formed from the side of the different kind of sheet, such that a portion of said different kind of sheet is buried in the through hole in a manner that the first ceramic sheet and the different kind of sheet are integrated together.

According to the method of the above first invention, a feature resides in that the first sheet (ceramic sheet) is partly substituted by the second sheet (different kind of sheet) to uniformly bury a different component in the predetermined portion of the first sheet. After formed, the sheet has a flat surface to realize a highly reliable composite sheet without defect in the lamination and defective connection, and the board exhibits improved reliability.

As an embodiment of the above method, further, there is provided a method of producing a composite sheet in which the different kind of sheet is a burn-and-extinguish sheet made of a material that extinguishes by burning through the heat treatment.

In this embodiment, a resin sheet is integrally compounded in the through hole of the green sheet and, hence, the sheet can be easily handled. Besides, in laminating a plurality of green sheets, the burn-and-extinguish sheet such as a resin sheet is buried in the cavity. Even when a high pressure is applied at the time of lamination, therefore, the bottom of the cavity does not swell despite the pressure is applied. Accordingly, a high lamination pressure can be applied without causing delamination.

It is therefore made possible to prevent the delamination of the laminate and to prevent the laminate from being deformed.

It is further possible to produce a ceramic board having a cavity without deformation in the sintered product of laminate by burning the laminate structure which comprises the above composite sheet to remove the resin sheet by the thermal decomposition.

The method of the above embodiment makes it possible to easily produce a good composite sheet having a cavity of a predetermined shape and size formed at a correct position, and is suited for the production of a ceramic board for packages for containing semiconductor devices.

It is desired that the burn-and-extinguish sheet contains resin beads having an average particle size of 1 to 20 μm, or is a carbon sheet made from a carbon powder.

As another embodiment of the method of the above first invention, there is provided a method of producing a composite sheet in which the different kind of sheet is a metal sheet made from a metal powder.

In the composite sheet produced by this embodiment, the metal sheet is buried in the through hole formed at a predetermined portion of the ceramic sheet, the metal sheet having substantially the same thickness as the above sheet. Therefore, there is realized a highly reliable composite sheet having flat surfaces without defect in the lamination or defective connection, enhancing the reliability of the board.

It is desired that the metal powder in the metal sheet contains a low-melting metal powder in an amount of 10 to 60% by volume and a high-melting metal powder in an amount of 40 to 90% by volume.

As a further embodiment of the method of the first invention, there is provided a method of producing a composite sheet in which the different kind of sheet is a second ceramic sheet formed from a ceramic powder different from that of the first ceramic sheet.

The composite sheet produced by this embodiment makes it possible to decrease or increase the dielectric constant in the desired portions only of the sheet, and offers an increased degree of freedom for designing the circuit.

It is desired that the composite sheet produced by this embodiment is obtained by printing a conductor on the surface of the second ceramic sheet.

Further, as a preferred embodiment of the method of the first invention, there is provided a method of producing a composite sheet by printing a conductor on the surface of the first ceramic sheet.

As another preferred embodiment of the method of the invention, there is provided a method of producing a composite sheet in which the first ceramic sheet is made of a ceramic material that can be fired at a temperature in excess of 1100° C.

As a further preferred embodiment of the method of the invention, there is provided a method of producing a composite sheet in which the first ceramic sheet is made of a ceramic material that can be fired at a low temperature of not higher than 1050° C.

As a still further preferred embodiment of the method of the first invention, there is provided a method of producing a composite sheet, comprising a step of swelling at least one of the first ceramic sheet or the different kind of sheet at a boundary portion thereof, and a step of pressing the composite sheet that has been swollen in the direction of thickness.

There is further provided a method of producing a composite sheet comprising a step of applying a paste onto the boundary portion between the first ceramic sheet and the different kind of sheet to form a coating layer on the above portion.

Further, a second invention is concerned with a method of producing a composite sheet comprising:

a step of preparing a first ceramic sheet and a different kind of sheet made of a material different from the first ceramic sheet, both of the sheets having substantially the same thickness;

a step of laminating the first ceramic sheet and the different kind of sheet one upon the other; and a step of preparing a composite sheet by pressing a predetermined portion of the laminate from the side of the different kind of sheet, such that the pressed portion of the different kind of sheet is transferred onto the side of the first ceramic sheet to integrate the first ceramic sheet and the different kind of sheet together.

According to the method of the second invention, the through hole in the ceramic green sheet is easily and uniformly filled with the sheet component of a different kind through one time of press working.

Besides, by changing the punching shape to meet the shape of a complex through hole, the through hole of any shape can be filled with the different kind sheet component.

As an embodiment of the method of the second invention, further, there is provided a method of producing a composite sheet in which the different kind of sheet is a burn-and-extinguish sheet made of a material that extinguishes by burning through the heat treatment.

It is desired that the burn-and-extinguish sheet contains resin beads having an average particle size of 1 to 20 μm, or is a carbon sheet made from a carbon powder.

As another preferred embodiment of the above method, there is provided a method of producing a composite sheet in which the different kind of sheet is a metal sheet made from a metal powder.

It is desired that the metal powder in the metal sheet contains a low-melting metal powder in an amount of 10 to 60% by volume and a high-melting metal powder in an amount of 40 to 90% by volume.

As a further embodiment of the above method, there is provided a method of producing a composite sheet in which the different kind of sheet is a second ceramic sheet formed from a ceramic powder different from that of the first ceramic sheet.

It is desired that the composite sheet produced by this embodiment is obtained by printing a conductor on the surface of the second ceramic sheet.

Further, as a preferred embodiment of the method of the second invention, there is provided a method of producing a composite sheet by printing a conductor on the surface of the first ceramic sheet.

As another preferred embodiment of the method of the invention, there is provided a method of producing a composite sheet in which the first ceramic sheet is made of a ceramic material that can be fired at a temperature in excess of 1100° C.

As a further preferred embodiment of the method of the invention, there is provided a method of producing a composite sheet in which the first ceramic sheet is made of a ceramic material that can be fired at a low temperature of not higher than 1050° C.

As a still further preferred embodiment of the method of the invention, there is provided a method of producing a composite sheet, comprising a step of swelling at least one of the first ceramic sheet or the different kind of sheet at a boundary portion thereof, and a step of pressing the composite sheet that has been swollen in the direction of thickness.

There is further provided a method of producing a composite sheet comprising a step of applying a paste onto the boundary portion between the first ceramic sheet and the different kind of sheet to form a coating layer on the above portion.

Further, a third invention is concerned with a method of producing a laminate by using a composite sheet, comprising a step of producing a laminate by laminating a first ceramic sheet or other composite sheet on the composite sheet produced by the method of the first invention or the second invention.

As an embodiment of the method of producing the laminate, there is provided a method of producing a laminate in which the different kind of sheet is a burn-and-extinguish sheet made of a material that extinguishes by burning through the heat treatment, and a cavity is formed by burning and extinguishing the burn-and-extinguish sheet through firing.

In the above embodiment, it is further desired that a step is provided for firing the laminate.

There is further provided a method of producing the laminate wherein the laminate forms a multi-layer circuit board.

DETAILED DESCRIPTION OF THE PREFERRED EMBODIMENTS

Preferred embodiments of the method of producing a composite sheet of the first and second inventions, and a method of producing a laminate of the third invention will now be concretely described with reference to the drawings.

Method of Producing a Composite Sheet (1) (First Invention)

A method of producing a composite sheet in which a different kind of sheet is a burn-and-extinguish sheet will now be described with reference to FIG. 1 which is a view of steps.

First, there are prepared a first ceramic sheet 1 and a resin sheet 2 which is a different kind of sheet that can be extinguished upon burning.

The first ceramic sheet 1 may have any thickness depending upon the use but is suitably from 20 to 400 μm from the standpoint of being compounded with the resin sheet 2.

It is further desired that the resin sheet 2 has a thickness which is substantially approximate to the first ceramic sheet 1, and that the thickness $t_2$ of the resin sheet 2 is from $0.9\ t_1$ to $1.1\ t_1$ with respect to the thickness $t_1$ of the first ceramic sheet 1.

First, a through hole 3 is formed in the first ceramic sheet 1 for forming a cavity.

This through hole 3 is formed by any one of, for example, punch working, slit working or laser working.

From the flow of a series of operations that will be described later, in particular, the punch working is best suited.

Figure 1:
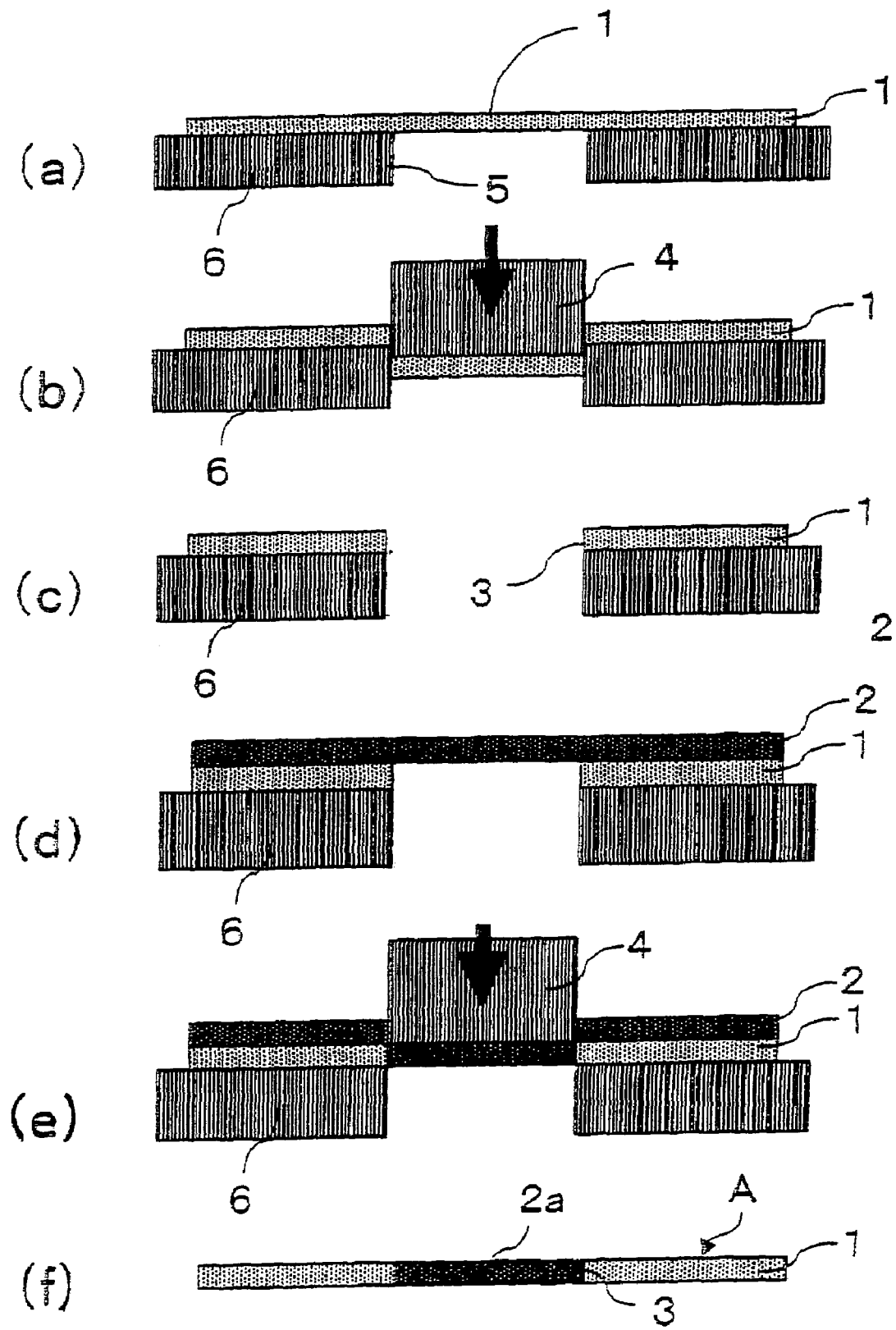
FIG. 1 is a view of steps illustrating a method of producing a composite sheet according to a first invention.

FIG. 1 illustrates the formation of the through hole 3 by the punch working.

Referring to FIG. 1(a), there is provided a punch press constituted by an upper punch 4 which is a drive unit and a lower punch 6 which supports the first ceramic sheet 1 and has an opening 5 formed therein. The sheet 1 is placed on the lower punch 6, and the upper punch 4 is driven downward in a manner as shown in FIG. 1(b) thereby to form a through hole 3 in the sheet 1 as shown in FIG. 1(c).

Referring next to FIG. 1(d), the resin sheet 2 is placed on the surface of the sheet 1 forming the through hole 3.

Then, the upper punch 4 is driven as shown in FIG. 1(e).

Here, the driving amount of the upper punch 4 is so adjusted as to set the position where the drive discontinues on the upper surface side of the sheet 1.

This makes it possible to bury the punched portion 2a of the resin sheet 2 in the cavity that has been formed in advance in the sheet 1 simultaneously with the punching of the resin sheet 2.

Thereafter, the upper punch 4 and the resin sheet 2 are removed to prepare a composite sheet A in an integrated form in which the resin sheet 2 is buried in the through hole 3 formed at a predetermined place of the first ceramic sheet 1 as shown in FIG. 1(f).

A first ceramic sheet (green sheet) 1 of a predetermined thickness is prepared by a known casting method such as doctor blade method or lip coater method by adding a suitable organic binder to a starting ceramic powder prepared at a predetermined ratio, and dispersing the mixture in an organic solvent to prepare a slurry thereof.

The first ceramic sheet has a thickness of usually 20 to 400 μm.

It is, on the other hand, desired that the burn-and-extinguish sheet which is the resin sheet 2 used in the embodiment is excellently punch-worked by press and is excellently decomposed by heat in the step of firing. To obtain an excellent punch workability, it is desired to add a powdery filler into the sheet.

The filler is favorably decomposed by heat during the firing, and resin beads, carbon powders are particularly effective as the filler. It is desired that the resin beads are at least the those selected from the group consisting of acrylic, styrene and butyral, and, particularly desirably, comprise an acrylic resin of the crosslinked type. It is further desired that the resin beads have an average particle size of from 1 to 20 μm from the standpoint of preventing coagulation among the beads and enhancing smoothness of the surface of the resin sheet.

This is also to prevent the acrylic resin beads from dissolving in an organic solvent.

In preparing the sheet containing above mentioned resin beads, it is desired that a heat-decomposable resin is added in an amount of 40 to 80 parts by weight to 100 parts by weight of the resin beads.

As preferred embodiments of carbon sheet, there can be exemplified sheets made from fine powders of natural graphite, artificial graphite or expansive graphite, or a carbon powder such as carbon black.

Concretely, it is desired that the sheet comprises from 20 to 80% by mass of carbon powder and from 80 to 20% by mass of heat-decomposable resin as an organic binder.

It is preferred that an average diameter of the carbon powder is from 3 to 100 μm, more preferably, from 5 to 50 μm.

As the heat-decomposable resin which is compounded in the burn and extinguish sheet of the present invention, there can be exemplified butyral resins obtained by reacting a polyvinyl alcohol and a butylaldehyde, acrylic resins which are composed either of arkyl methacrylate or arkyl acrylate or a mixture thereof as monomer component such as a polymethyl methacrylate, a polyethyl methacrylate, a polymethyl acrylate.

Particularly, it is preferred that an acrylic resin having a hydroxyl group or a carboxylic group.

In producing the burn and extinguish sheet, a powder of above mentioned predetermined composition is mixed with an organic solvent such as toluene, hexane, heptane and is dispersed in the solvent preparing slurry, and then the slurry is coated onto a carrier sheet to which a parting agent has been applied by a known coating method such as roll coater, gravure coater or blade coater, and is dried to prepare a resin sheet.

Otherwise, it may produce the sheet by using press molding, extrusion molding.

According to the method of the above embodiment, a composite sheet comprising the first ceramic sheet and the burn-and-extinguish sheet such as the resin sheet, which are partly integrated together, can be easily formed through two times of punching work.

Besides, when a ceramic board (laminate) having a cavity is to be formed, the composite sheet obtained above suppresses the deformation of the board and the occurrence of peeling among the layers (delamination), enhances the flatness on the bottom surface of the cavity, and improves reliability in mounting the electronic part on the bottom surface of the cavity.

Next, described below is a case of when the different kind of sheet is a metal sheet. This embodiment is essentially the same as the above embodiment except that the sheet 2 is a metal sheet instead of the burn-and-extinguish sheet.

This will now be briefly described with reference to FIG. 1.

A first ceramic sheet 1 and a metal sheet 2 are prepared.

The sheet 1 may have any thickness. In this embodiment, however, the sheet 1 has a thickness which is suitably from 50 to 300 μm from the standpoint of being compounded with the metal sheet 2.

It is further desired that the resin sheet 2 has a thickness which is substantially approximate to that of the first ceramic sheet 1, and that the thickness $t_2$ of the sheet 2 is from $0.9\ t_1$ to $1.1\ t_1$ with respect to the thickness $t_1$ of the sheet 1.

A through hole 3 is formed in the sheet 1 for forming a cavity by punch work relying upon the press.

To form the through hole 3, there is provided a punch press constituted by an upper punch 4 which is a drive unit and a lower punch 6 which has an opening 5 formed therein. The sheet 1 is placed on the lower punch 6 (FIG. 1(*a*)), and the upper punch 4 is driven downward (FIGS. 1(*b*), (*c*)).

Next, the metal sheet 2 is placed on the surface of the sheet 1 in which the through hole 3 has been formed (FIG. 1(*d*)).

Then, the upper punch 4 is driven.

Here, the driving amount of the upper punch 4 is so adjusted as to set the position where the drive of the lower surface of the upper punch discontinues on the upper surface side of the sheet 1 (FIG. 1(*e*)).

This makes it possible to bury the punched portion 2*a* of the metal sheet 2 in the cavity that has been formed in advance in the first ceramic sheet 1 simultaneously with the punching of the metal sheet 2.

Thereafter, the upper punch 4 and the metal sheet 2 are removed to prepare a composite sheet A in an integrated form in which the metal sheet 2*a* is buried in the through hole 3 formed at a predetermined place of the sheet 1 as shown in FIG. 1(*f*).

A first ceramic sheet 1 used in this embodiment, too, is prepared by the method of preparing the ceramic green sheet 1 of a predetermined thickness by adding an organic binder to a starting ceramic powder prepared at a predetermined ratio, dispersing the mixture in an organic solvent to prepare a slurry thereof, and casting the slurry.

The thickness is usually from 50 to 400 μm.

When a sheet thinner than 50 μm is to be formed, the slurry that is prepared is applied onto a carrier sheet to which a parting agent has been applied by a known coating method such as roll coater, gravure coater or blade coater, and is dried to prepare a sheet.

On the other hand, the metal sheet 2 used in this embodiment is made from a mixture of a metal powder and an organic binder. In order to enhance the punch workability by press and to enhance the decomposition by heat through the firing, it is desired that the organic binder is an acrylic resin and, particularly, an acrylic resin comprising an isobutyl methacrylate as a main skeleton.

It is further desired that the metal component comprises 10 to 60% by volume of a low-melting metal powder and 40 to 90% by volume of a high-melting metal powder.

As the low-melting metal, there can be preferably used at least the one selected from the group consisting of Cu, Ag, Au and Al. As the high-melting metal, there can be preferably used at least the one selected from the group consisting of tungsten, molybdenum and manganese.

By blending the low-melting metal and the high-melting metal in a range as described above, it is made possible to increase the rigidity of the metal sheet as well as to enhance the punch workability of the metal sheet. After firing, further, the metal layer exhibits a decreased resistance and enhanced heat conductivity.

It is desired that the firing is effected at a temperature higher than a melting point of the low-melting metal, in order to form a texture occupied by the low-melting metal by melting the grain boundaries of the high-melting metal particles.

On account of the foregoing points, the amount of the high-melting metal is selected to be not smaller than 40% by weight to maintain the shape of the metal layer even when the low-melting metal is melted, to suppress the occurrence of stress that stems from a difference in the thermal expansion between the metal layer and the ceramic insulating layer such as $Al_2O_3$, and to prevent the occurrence of cracks in the wiring layer or in the insulating layer.

By selecting the amount of the low-melting metal to be not smaller than 10% by weight, further, it is made possible to decrease the resistance of the metal layer and to increase the heat conductivity.

In preparing the metal sheet, the organic binder is added in an amount of 1 to 10 parts by weight to 100 parts by weight of the metal powder, and the mixture is dispersed in an organic solvent such as toluene, hexane or heptane.

A plasticizer may be added to impart flexibility to the sheet.

It is further desired that the low-melting metal powder has an average particle size of from 0.8 to 12 μm to enhance the dispersion of the powder.

It is desired that the high-melting metal powder, too, is dispersed in a matrix of copper in the form of spherical sintered particles or sintered particles each comprising fused several particles having an average particle size of from 0.8 to 12 μm. The particles having an average particle size of not smaller than 0.8 μm work to maintain the shape of the metal layer 2 and to decrease the resistance of the metal layer. The particles having an average particle size of not larger than 12 μm work to prevent the resistance of the metal layer from increasing that results when the matrix of the low-melting metal is divided by the high-melting metal particles.

It is most desired that the high-melting metal is dispersed having an average particle size of from 1.5 to 5 μm and, particularly, from 1.3 to 3 μm.

According to the embodiment of the first invention, the composite sheet comprising the first ceramic sheet and the metal sheet that are partly integrated together can be easily formed by two times of punch work.

Besides, the composite sheet that is prepared suppresses the deformation of the ceramic board or the defective filling at the time of forming the ceramic board having a metal layer, and works to heighten the flatness of the metal layer and the reliability in mounting the electronic part.

Next, described below is an embodiment where the different kind of sheet is a second ceramic sheet of a material different from that of the first ceramic sheet.

This embodiment, too, is essentially almost the same as the above embodiment except that the sheet 2 is a ceramic sheet instead of the resin sheet or the metal sheet.

Therefore, the description refers to FIG. 1.

A first ceramic sheet 1 and a second ceramic sheet 2 are prepared, first.

In the case of this embodiment, the first ceramic sheet 1 has a thickness which is suitably from 50 to 300 μm from the standpoint of being compounded with the second ceramic sheet 2.

It is further desired that the second ceramic sheet 2 has a thickness which is substantially approximate to that of the first ceramic sheet 1, and that the thickness $t_2$ of the second ceramic sheet 2 is from 0.9 $t_1$ to 1.1 $t_1$ and, particularly, from 0.95 $t_1$ to 1.05 $t_1$ with respect to the thickness $t_1$ of the first ceramic sheet 1.

It is further desired that the first and second ceramic sheets have relative densities of from 45 to 60%, and that a difference therebetween is not larger than 5%, particularly, not larger than 3% and, more particularly, not larger than 1% to thereby bring the contraction coefficients into match with each other during the firing.

First, a through hole 3 is formed in the first ceramic sheet 1 for forming a cavity by punch work using a metal mold.

To form the through hole 3, there is provided a punch press constituted by an upper punch 4 and a lower punch 6. The sheet 1 is placed on the lower punch 6, and the upper punch 4 is driven downward.

Next, the second ceramic sheet 2 is placed on the surface of the first ceramic sheet 1 in which the through hole 3 has been formed, and the upper punch 4 is driven. The position for discontinuing the drive of the upper punch 4 is set on the upper surface side of the sheet 1.

This makes it possible to bury the punched portion 2a of the second ceramic sheet 2 in the cavity 3 that has been formed in advance in the first ceramic sheet 1 simultaneously with the punching of the second ceramic sheet 2.

Thereafter, the upper punch 4 and the second ceramic sheet 2 are removed to prepare a composite sheet in which the second ceramic sheet 2 is buried in a predetermined place of the first ceramic sheet 1.

The first ceramic sheet (green sheet) 1 used in the embodiment of the first invention is prepared by adding an organic binder to a starting ceramic powder prepared at a predetermined ratio, dispersing the mixture in an organic solvent to prepare a slurry thereof, and molding the slurry into a sheet having a predetermined thickness by the casting method.

The thickness of the sheet is usually from 50 to 300 μm.

When a sheet thinner than 50 μm is to be formed, the slurry that is prepared is applied onto a carrier sheet to which a parting agent has been applied by a known coating method such as roll coater, gravure coater or blade coater, and is dried to prepare a sheet.

On the other hand, the second ceramic sheet 2 used in this embodiment has good punch workability and has excellent decomposition property by heat during the firing. It is desired that the organic binder is an acrylic high-molecular binder comprising an isobutyl methacrylate as a main skeleton.

In preparing the second ceramic sheet 2, the acrylic binder is added in an amount of 1 to 10 parts by weight per 100 parts by weight of the ceramic powder, and the mixture is dispersed in an organic solvent such as toluene, hexane or heptane.

Here, a plasticizer may be added to impart flexibility to the sheet.

Further, though the composition of the ceramic powder may differ depending upon the object, it is necessary that the first ceramic sheet 1 and the second ceramic sheet 2 are fired at substantially the same firing temperature.

For example, the first and second ceramic sheets 1 and 2 are formed of ceramic materials that can be fired at temperatures in excess of 1100° C. and, particularly, at temperatures of not lower than 1200° C.

Concretely speaking, when the first ceramic sheet 1 is formed of at least one kind selected from the group consisting of, for example, alumina, aluminum nitride, silicon nitride and forsterite, it is desired that the second ceramic sheet 2 is formed of a ceramic material that can be fired at the same temperature as the first ceramic sheet 1 and that contains, as a chief component, at least one of those selected from the group consisting of alumina, aluminum nitride, silicon nitride, forsterite, mullite, enstatite, silica and cordierite, being, as required, blended with ceramics and metal components for decreasing the dielectric constant, increasing the dielectric constant or for forming the ceramics.

More concretely speaking, when the second ceramic sheet 2 of a low dielectric constant is to be formed on the first ceramic sheet 1 of ceramics comprising alumina as a chief component, it is desired that the second ceramic sheet 2 is formed of a ceramic material containing at least one of mullite, forsterite, enstatite, silica and cordierite as a chief component.

It is further desired that the second ceramic sheet 2 of a high dielectric constant is formed by using a ceramic material which contains alumina as a chief component and further contains a metal powder such as tungsten or molybdenum in an amount of 1 to 30% by mass.

When the second ceramic sheet 2 is to be formed of a magnetic ceramic material, further, it is desired that the ceramic material contains iron oxide as a chief component.

When the first ceramic sheet 1 is formed of at least one of those selected from the group consisting of alumina, aluminum nitride, silicon nitride and forsterite, the metallized layer is formed of a metallizing material containing at least one of those selected from the group consisting of tungsten, molybdenum and manganese as a chief component.

Further, the first and second ceramic sheets 1 and 2 can be formed by using ceramic materials that can be fired at temperatures of not higher than 1100° C. and, particularly, at temperatures of not higher than 1050° C.

For example, the first and second ceramic sheets 1 and 2 are formed of a glass or a ceramic material which is a mixture of a glass and an inorganic filler (hereinafter generally referred to as glass ceramic material).

In this case, the first and second ceramic sheets 1 and 2 are formed of materials containing different glasses and/or fillers.

Concretely speaking, when the second ceramic sheet 2 of a low dielectric constant is to be formed, it is desired that the second ceramic sheet 2 is formed by using a glass ceramic material containing at least one filler selected from the group consisting of a glass having a low dielectric constant or a silica having a low dielectric constant, cordierite and enstatite.

Concretely, further, when the second ceramic sheet 2 of a high dielectric constant is to be formed, it is desired that the second ceramic sheet 2 is formed by using a glass ceramic material containing a titanate such as $BaTiO_3$ or $LaTiO_3$ as a filler.

Further, when the second ceramic sheet 2 is to be formed of a magnetic ceramic material, it is desired to use a glass ceramic material containing a compound which contains at least elements of the iron group.

When the first and second ceramic sheets 1 and 2 are to be formed of ceramic materials that can be fired at low temperatures as described above, the metallized layer is formed by using a metallizing material that contains at least one element selected from the group consisting of Cu, Ag and Al as a chief component.

It is further allowable to form a conductor layer by printing a conductor such as the metal described above on the surface of the second ceramic sheet.

According to the embodiment of the first invention, the composite sheet comprising the first ceramic sheet and the second ceramic sheet that are partly integrated together can be easily formed by two times of punch work.

Besides, the composite sheet that is prepared suppresses the deformation of the ceramic board, defective filling and defective lamination at the time of forming the ceramic board having a layer of a low dielectric constant or a high dielectric constant, and works to heighten the reliability in mounting the electronic part.

According to this embodiment of the invention, the layers having different dielectric constants can be formed on the same plane contributing to greatly increasing the degree of freedom in designing the circuit.

Method of Preparing a Composite Sheet 2 (Second Invention)

An embodiment of when the different kind of sheet is the burn-and-extinguish sheet will be described with reference to FIG. 2 which is a view of steps.

Figure 2:
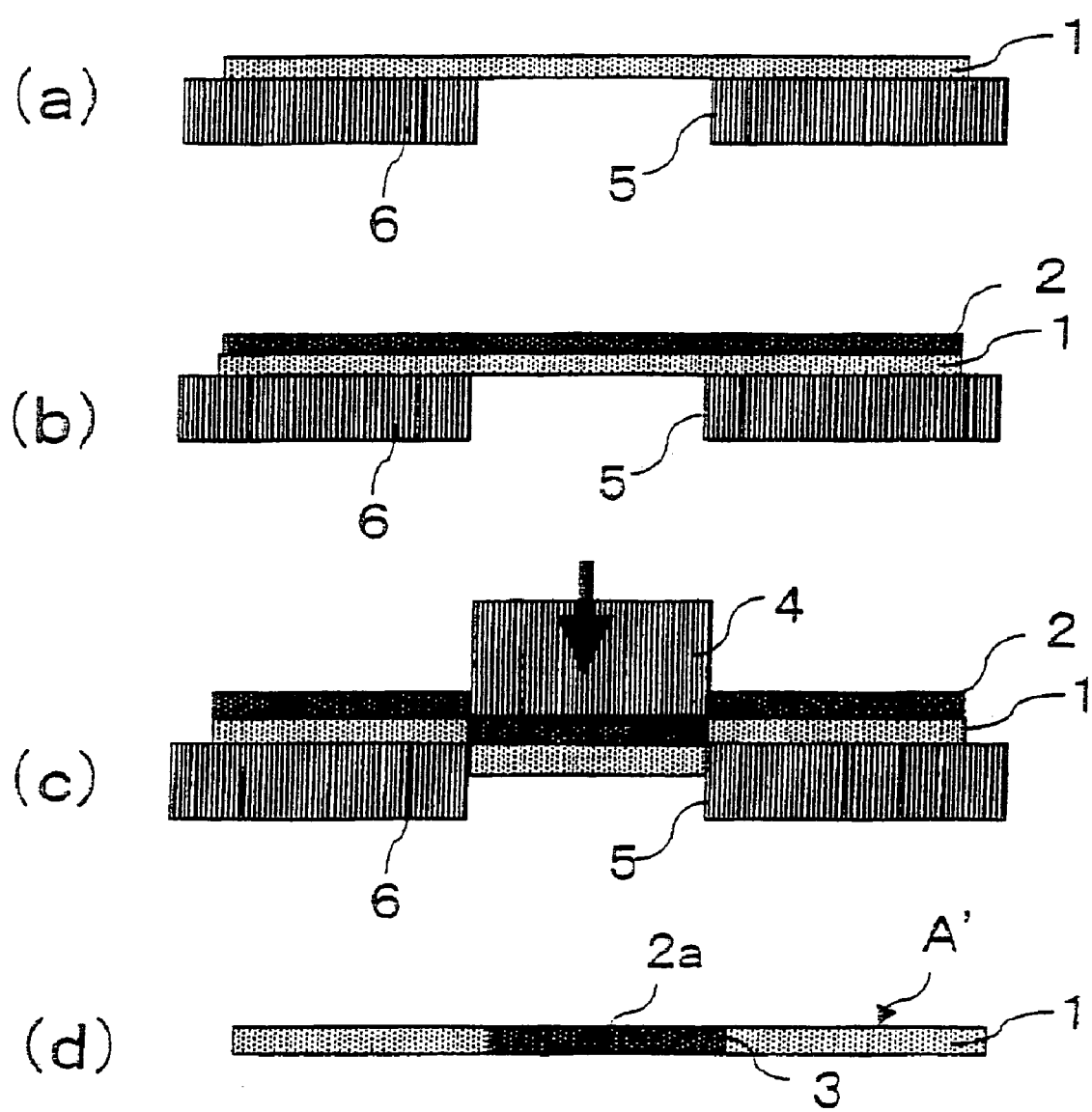
FIG. 2 is a view of steps illustrating a method of producing a composite sheet according to a second invention.

In FIG. 2, too, there are prepared a first ceramic sheet 1 and a resin sheet (burn-and-extinguish sheet) 2 having substantially the same thickness like in FIG. 1.

Referring to FIG. 2(*a*), the first ceramic sheet 1 is placed on the lower punch 6. Then, as shown in FIG. 2(*b*), the resin sheet 2 is laminated on the first ceramic sheet 1.

Here, it is desired that the resin sheet 2 is lightly and temporarily secured to the first ceramic sheet 1 with an adhesive or the like to preclude such hindrance as peeling while the resin sheet 2 is being treated.

Referring next to FIG. 2(*c*), the upper punch 4 is driven, and a position for discontinuing the drive of the upper punch 4 is set on the upper surface side of the first ceramic sheet.

Thus, the first ceramic sheet 1 and the resin sheet 2 can be simultaneously punched.

Then, the upper punch 4 and the resin sheet 2 are removed, and the first ceramic sheet 1 is peeled off the lower punch 6 to obtain a composite sheet A of an integrated form in which the resin sheet 2 is buried in the through hole 3 formed in a predetermined portion of the first ceramic sheet 1 as shown in FIG. 2(*d*).

The materials, sizes, shapes and preparation methods of the first ceramic sheet and of the burn-and-extinguish sheet of the embodiment of the second invention are the same as those of the embodiment of the first invention, and are not described here again.

Next, described below is a case where the different kind of sheet is a metal sheet. This embodiment is essentially the same as the above embodiment except that the sheet 2 is a metal sheet instead of the burn-and-extinguish sheet such as a resin sheet.

Therefore, the description refers to FIG. 2.

Like the above embodiment, a first ceramic sheet 1 and a metal sheet 2 are prepared having substantially the same thickness.

The sheet 1 is placed on the lower punch 6 and the metal sheet 2 is laminated on the sheet 1.

Here, it is desired that the two are lightly and temporarily secured with an adhesive or the like.

The upper punch 4 is driven, and the position for discontinuing the drive of the upper punch 4 is set on the upper surface side of the ceramic sheet 1.

This makes it possible to simultaneously punch the ceramic sheet 1 and the metal sheet 2 and, at the same time, to bury the punched portion of the metal sheet 2 in the through hole 3 of the ceramic sheet 1.

Then, the upper punch 4 and the punched metal sheet 2 are removed, and the ceramic sheet 1 is peeled off the lower punch 6 to obtain a composite sheet A of an integrated form in which the metal sheet 2 is buried in a predetermined portion of the ceramic sheet 1.

The materials, sizes, shapes and preparation methods of the first ceramic sheet and of the metal sheet of this embodiment are the same as those of the embodiment of the first invention, and are not described here again.

Next, described below is a case where the different kind of sheet is a second ceramic sheet formed of a material different from the first ceramic sheet.

This embodiment is almost the same as the above embodiment except that the sheet 2 is a different kind of ceramic sheet instead of the resin sheet or the metal sheet.

Therefore, the description refers to FIG. 2.

A first ceramic sheet 1 and a second ceramic sheet 2 are prepared having substantially the same thickness.

The first ceramic sheet 1 is placed on the lower punch 6 and the second ceramic sheet 2 is laminated on the first ceramic sheet 1.

Here, it is desired that the two ceramic sheets are lightly and temporarily secured with an adhesive or the like.

The upper punch 4 is driven, and the position for discontinuing the drive of the upper punch 4 is set on the upper surface side of the first ceramic sheet 1.

This makes it possible to simultaneously punch the sheet 1 and the sheet 2.

Then, the upper punch 4 and the sheet 2 are removed, and the sheet 1 is peeled off the lower punch 6 to obtain a composite sheet A of an integrated form in which the second ceramic sheet 2 is buried in a predetermined portion of the first ceramic sheet 1.

According to the first and second inventions as described above, the composite sheet is easily formed through one or two times of punch work, the composite sheet having a different kind of sheet (resin, metal, different ceramic) 2 with a thickness substantially the same as that of the first ceramic sheet 1 buried in the through hole 3 in the first ceramic sheet 1.

When the production method of the first invention is compared with the production method of the second invention, the method of the second invention effects the punch work one time, which is less than two times of punch work effected in the method of the first invention, and is effective in simplifying the steps.

In the method of the first invention, further, the through hole is formed in advance in the first ceramic sheet 1 and, then, a portion of the different kind of sheet such as the resin sheet is buried therein. Therefore, the composite sheet exhibits excellent smoothness on the boundary portion between the different kind of sheet and the ceramic sheet, and burying process is accomplished maintaining high accuracy and good appearance.

It is desired that the composite sheets obtained in the first and second inventions have a conductor layer printed on the surface of the first ceramic sheet so as to be adapted to ceramic wiring boards (laminates) that will be described later.

The first ceramic sheet may be constituted by using a ceramic material which can be fired at a temperature not lower than 1100° C. or may be constituted by using a ceramic material that can be fired at a low temperature which is not higher than 1050° C. depending upon the mode of the composite sheet.

That is, when a metallized layer is to be formed on the surface of the first ceramic sheet, there is selected the first ceramic sheet that can be fired at a temperature of not higher than 1050° C. depending upon the melting point of the metallizing metal.

In the composite sheet of the embodiment in which the different kind of sheet is the second ceramic sheet, the firing must be simultaneously effected at substantially the same firing temperature. When the second ceramic sheet uses the ceramics that must be fired at high temperatures, therefore, the first ceramic sheet is selected depending upon the firing temperature.

Next, described below are further preferred embodiments of the method of producing a composite sheet according to the first and second inventions.

The first one is a method of producing a composite sheet of the invention further comprising a step of swelling at least one of the first ceramic sheet or the different kind of sheet at a boundary portion thereof, and a step of pressing the composite sheet that has been swollen in the direction of thickness.

Figure 3:
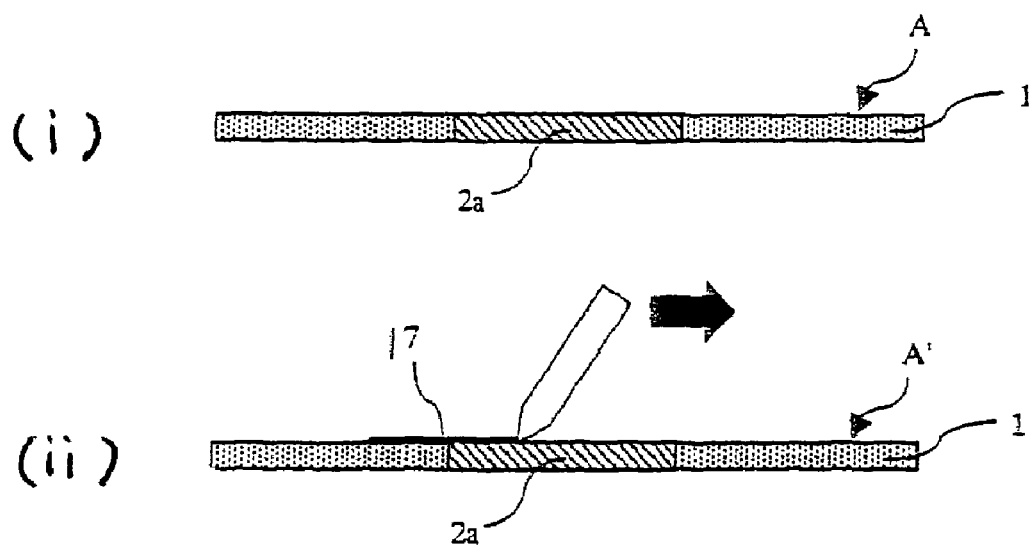
FIG. 3 is a view illustrating a preferred embodiment of the method of producing a composite sheet according to the first and second inventions.

That is, referring to FIG. 3(*i*), in the composite sheet A obtained by the method of the first and second inventions, a solvent is supplied to the boundary portion between the first ceramic sheet 1 and the punched portion 2*a* of the second sheet (different kind of sheet) 2 buried in the first ceramic sheet 1, whereby the boundary portion is swollen and pressurized to prevent the deformation and to eliminate the gap (FIG. 3(*ii*)).

In this embodiment, the composite sheet is more desirably the one produced by the method of the first invention.

That is, prior to compounding the first ceramic sheet and the different kind of sheet together, the through hole is pierced in the first ceramic sheet by punch work based on the press to easily insert the different kind of sheet in the through hole formed in the first ceramic sheet maintaining excellent smoothness on the boundary portion between the different kind of sheet and the ceramic sheet, high accuracy and good appearance.

It is important to carry out the swelling treatment to swell the boundary portion between the first ceramic sheet 1 and the different kind of sheet 2*a* of the composite sheet A by applying a solvent 17 to the boundary portion so as to infiltrate therein.

The solvent used for the swelling may be suitably selected depending upon the kind of the first ceramic sheet and the different kind of sheet (second sheet) used in combination therewith. In the case of, for example, the glass/alumina.acrylic resin beads composite sheet belonging to the composite sheet of the type of ceramic.burn-and-extinguish sheet, there can be preferably used such a solvent as an eater like a butyl acetate, a ketone like an acetone, alcohol like an isopropyl alcohol (IPA), aromatics such as a toluene, a xylene and a butyl carbitol acetate (BCA), a dioctyl phthalate (DOP), a dimetyl phthalate (DMP), a diethyl phthalate (DEP) or a dubutyl phthalate (DBP) etc.

In the case of the alumina.cupper/tungsten alloy composite sheet which is a composite sheet of the type of ceramic.metal sheet, there can be preferably used such a solvent as a butyl carbitol acetate (BCA), a dioctyl phthalate (DPO), a dimetyl phthalate (DMP), a diethyl phthalate (DEP) or a dibutyl phthalate (DBP) etc.

In the case of the alumina-forsterite composite sheet which is a composite sheet of the type of ceramic.ceramic sheet, there can be preferably used such a solvent as a butyl carbitol acetate (BCA), a dioctyl phthalate (DOP), a dimetyl hthalate (DMP), a diethyl phthalate (DEP) or a dibutyl phthalate (DBP) etc.

The swelling treatment may consist of, for example, dripping a small amount of solvent while running a fine tube along the boundary, or absorbing a solvent by using a porous material such as sponge and applying the solvent by bringing the porous material into contact with the boundary.

Next, it is important to press the swollen composite sheet A' in the direction of thickness.

Due to the pressing, it is allowed to integrate the first sheet and the different kind of sheet together to obtain the composite sheet A' without gap between the sheets.

According to the preferred embodiment of the invention as described above, it is allowed to easily form, by using a pressing device, a composite sheet in which the different kind of sheet 2 is buried in the through hole of the first ceramic sheet 1, the different kind of sheet 2 having substantially the same thickness as the first ceramic sheet 1 through one or two times of punching.

Therefore, the punched portion 2*a* of the different kind of sheet of other component having a uniform thickness is formed in the substituted portion of the first ceramic sheet 1.

According to the preferred embodiment, the swelling treatment is conducted after the sheet is substituted followed by punching. Therefore, the two sheet are integrated together to obtain a composite sheet which is deformed little.

Further, the composite sheet has a substantially small step or gap in the interface between the two sheets and prevents breakage of the lines or the defective connection even when a circuit pattern is formed on the surface.

At the time of handling the composite sheet in which the first ceramic sheet 1 is partly substituted by the different kind of sheet 2, it is desired that the two sheets are lightly and temporarily secured together by using an adhesive or the like until the step of integration is finished to prevent the different kind of sheet 2 from peeling.

According to a second preferred embodiment, the methods of producing a composite sheet of the first and second inventions comprise a step of applying a paste onto the boundary portion between the first ceramic sheet and the different kind of sheet to form a coating layer on the above portion.

According to the method of this embodiment, the coating layer is formed on the boundary portion lowering the effect of a gap between the first ceramic sheet and the different kind of sheet, preventing the moisture or oxygen from entering into the inside, and enhancing the reliability of the board.

When the first ceramic sheet is partly removed and a different kind of sheet is filled in the space, there is formed a gap of several microns to several tens of microns between the boundary of the first ceramic sheet and that of the different kind of sheet though it may vary depending upon the method of production.

Even when there is almost no gap, a gap is often formed due to a difference in the contraction when fired.

When there is a gap between the sheets, the moisture or oxygen infiltrates through the gap to oxidize the metal layer, to assist the migration of the wiring layer and to discolor or corrode the ceramics. Formation of the coating layer on the surface of the junction interface eliminates the above adverse effect.

It is desired that the coating layer is a paste of a ceramic material.

When a paste of a ceramic material is used as the coating layer, the junction to the ceramic layer becomes strong improving the junction reliability and, at the same time, effectively suppressing the deterioration of characteristics due to the infiltration of moisture from the outer side.

In particular, it is desired that the coating layer comprises two layers having a metal layer formed between the ceramic layer and the sheet.

The metal layer easily undergoes plastic deformation and helps realize a coating layer that peels little despite of the residual stress and develops cracks little.

It is desired to form a metallizing layer on at least one surface of the composite sheet.

This makes it possible to accomplish an electric connection to the external unit and, at the same time, to decrease the size of the composite sheet itself by employing the multi-layer structure.

Figure 4:
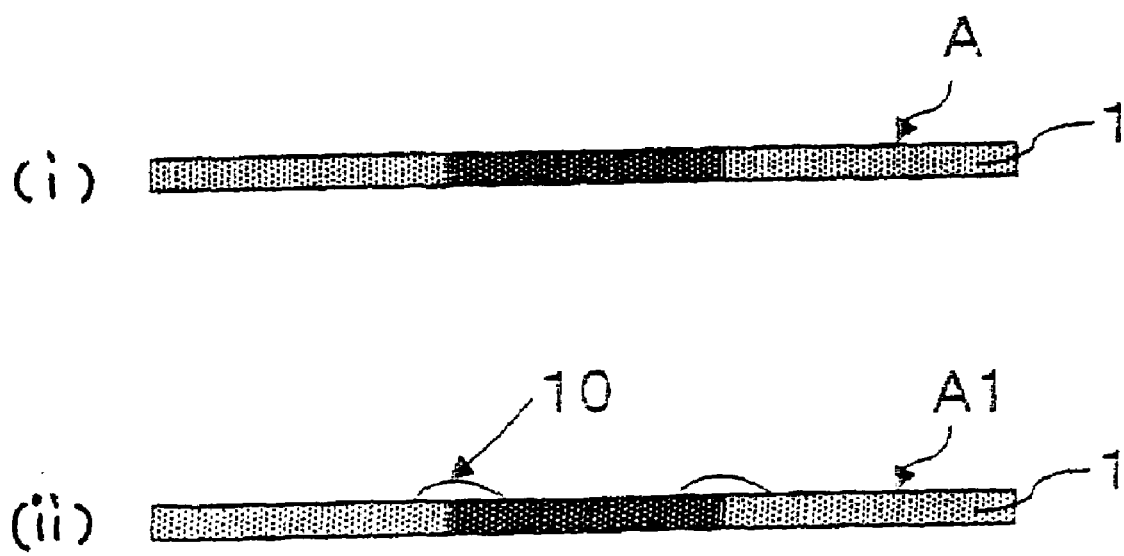
FIG. 4 is a view illustrating another preferred embodiment of the method of producing a composite sheet according to the first and second inventions.

According to a preferred embodiment, a third coating layer (10) is so applied as to cover at least the junction interface between the first ceramic sheet 1 and the different kind of sheet of the composite sheet shown in FIG. 4(i) thereby to obtain a composite sheet (A1) integrating the first ceramic sheet and the different kind of sheet as shown in FIG. 4(ii).

The composite sheet produced by the method of the above embodiment is favorably used for the production of a ceramic board of a multi-layer structure having layers of different materials, such as a metal layer and a capacitor layer having a high dielectric constant or a low dielectric constant.

Method of Producing a Laminate by Using the Composite Sheet (Third Invention).

Described below is a method of producing a laminate by laminating a ceramic sheet or a composite sheet on the composite sheet of the first and second inventions.

(Method of Producing a Laminate by Using a Ceramic.Burn-and-Extinguish Composite Sheet)

Described below is a method of producing a ceramic board (laminate) with reference to FIG. 5 which is a view of steps.

Referring to FIGS. 5(a) and 5(b), the composite sheet (ceramic.resin composite sheet) A1 produced through the step of FIG. 1 or 2 is integrally laminated with a composite sheet A2 that is similarly produced and with ceramic sheets B1, B2 and B3 that have not been compounded with the resin sheet by using an adhering solution or the like to produce a laminate C.

Then, the laminate C is so fired that the resin sheet is removed by heat decomposition and the ceramic sheets (green sheets) are fired to become dense thereby to form a ceramic board (laminate) D having a cavity 7 in the portion where the resin sheet 2 had been buried.

In effecting the integral lamination according to this method, there exists no large gap in the sheet unlike that of the prior art. Therefore, the individual sheets can be handled very easily, and the sheets are not deformed or damaged unlike that of handling the conventional sheets having a large through hole formed therein.

In integrally laminating the ceramic green sheets, further, it is desired to apply a pressure of 3 to 7 MPa to prevent the occurrence of defective lamination or delamination after firing.

According to the method of the present invention, further, a high pressure can be applied so that the bottom of the portion where the cavity has been formed will receive a sufficiently high pressure via the resin sheet 2, since the through hole has been filled with the resin sheet.

As a result, it is allowed to suppress the deformation of the green sheet at the bottom forming the cavity and the occurrence of delamination after firing.

Figure 5:
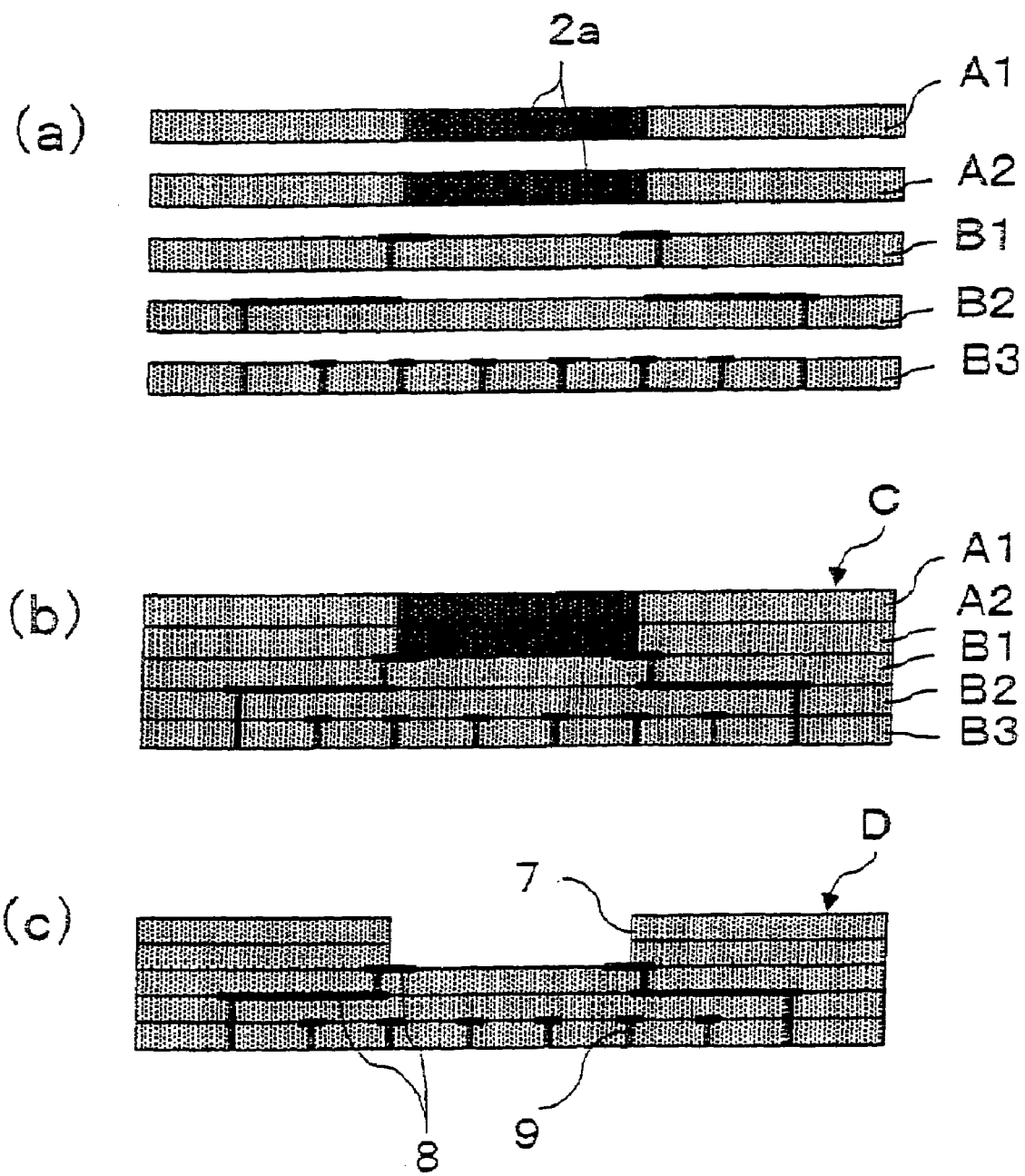
FIG. 5 is a view of steps illustrating a method of producing a laminate having a cavity by using the composite sheet of the invention.

As shown in FIG. 5, further, a metallized wiring layer 8 can be formed on the ceramic green sheets for being adapted to the ceramic wiring board.

The metallized wiring layer 8 can be formed by applying a metal paste that is obtained by adding an organic binder, a solvent and a plasticizer to a metal powder onto the ceramic sheets in a predetermined pattern by a screen-printing method or the like method prior to integrally laminating.

Through holes are formed in the sheet by a micro-drill or a laser working and are filled with a metal paste to form via conductors 9. The metallized wiring layers 8 formed on the different layers can be electrically connected together using the via conductors 9.

(Method of Producing a Laminate by Using a Ceramic-.Metal Composite Sheet)

Described below is a method of producing a ceramic board (laminate) with reference to FIG. 6 which is a view of steps.

The ceramic.metal composite sheet is desirable for producing a ceramic board (laminate) of a multi-layer structure having a metal layer.

Referring to FIGS. 6(a) and 6(b), the ceramic.metal composite sheet A1 produced through the step of FIG. 1 or 2 is integrally laminated with a composite sheet A2 that is similarly produced and with ceramic sheets B1, B2 and B3 that have not been compounded with the metal sheet by using an adhering solution or the like to produce a laminate C.

Then, the laminate C is heated at a temperature at which the ceramic green sheets and the metal sheets 2a are sintered, whereby the metal sheets are sintered to form metal layers, and the ceramic green sheets are fired to become dense. Thus, there is formed a ceramic board D of a multi-layer structure having metal layers 7' as shown in FIG. 6(c).

In burying the metal components in the through hole formed in the ceramic green sheet, the method of the present invention eliminates the need of flowing the paste into the recessed portion formed by laminating the ceramic green sheets in which the through holes are formed together other green sheets unlike that of the prior art; i.e., the present invention makes it possible to bury a rigid metal sheet in a sheet by punching without using paste. Therefore, the green sheet in which the metal sheet is buried can be handled by itself. By simply laminating the sheet in which the metal sheet is buried on other green sheet by matching their positions, it is allowed to easily obtain a laminate in which the metal component is buried in the through holes of the green sheets.

According to the method of the present invention, further, there is no deformation such as dent in the metal component-filled portion that occurs when the paste is used. Therefore, no gap is formed in the interface of laminate that is obtained by integrally laminating the sheets.

Besides, according to the method of the present invention, a pressure which is as high as 3 to 7 MPa is applied at the time of lamination and is uniformly imparted to suppress the deformation of the laminate since the through hole has been filled with the highly rigid metal sheet.

Figure 6:
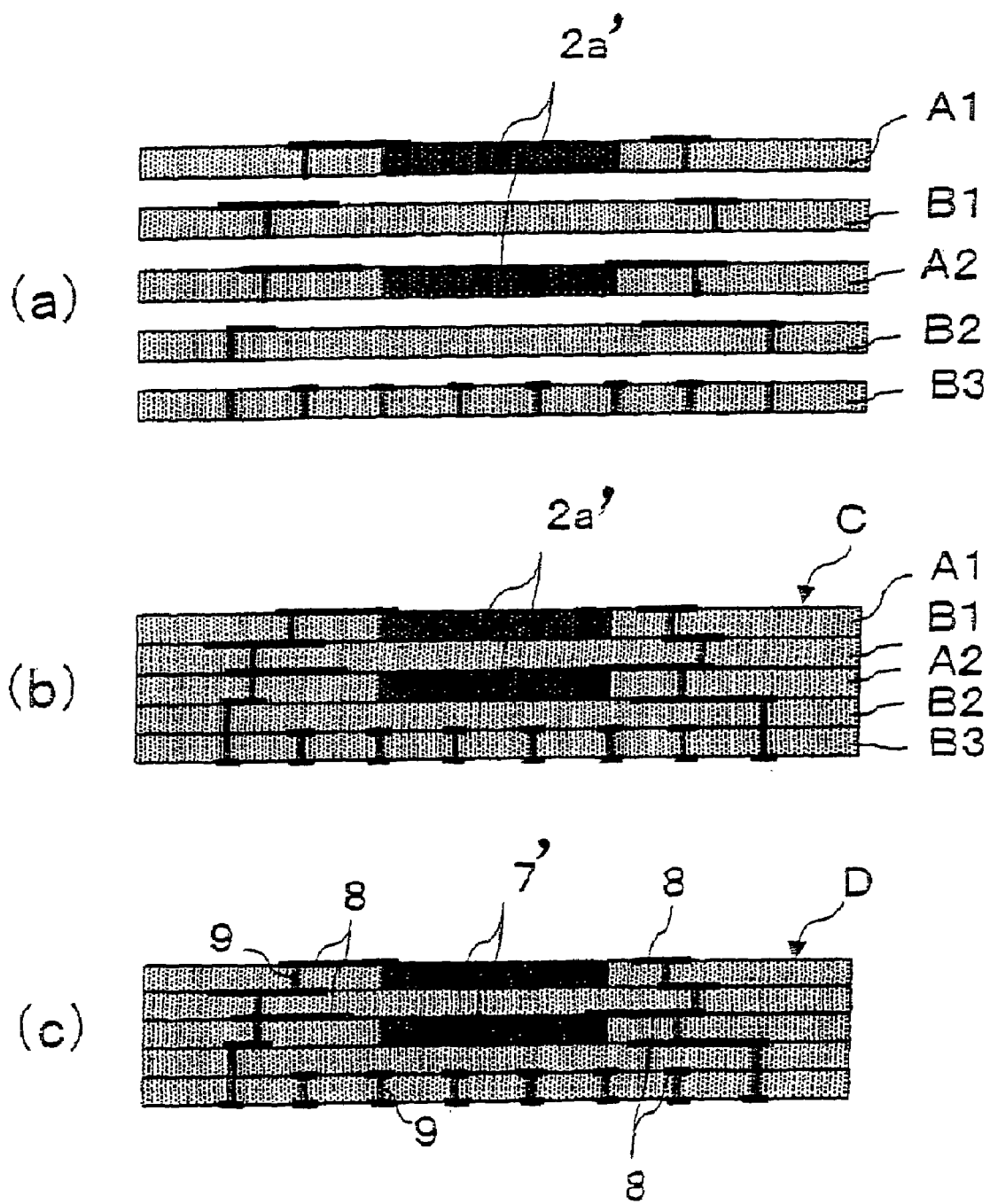
FIG. 6 is a view of steps illustrating a method of producing a laminate having a metal layer by using the composite sheet of the invention.

According to the third invention, metallized wiring layers 8 can be suitably formed on the surfaces of the composite sheets A1 and A2 as shown in FIG. 6 for being adapted to the ceramic wiring boards.

The metallized wiring layers 8 are formed by printing a metal paste onto the surfaces of the composite sheets A1 and A2 in a predetermined pattern.

Further, the through holes formed in the composite sheets A1 and A2 are filled with a metal paste to form via conductors 9. The metallized wiring layers 8 formed on different layers can be electrically connected together by using the via conductors 9.

(Method of Producing a Laminate by Using a Ceramic.Ceramic Composite Sheet)

Described below is a method of producing a ceramic board (laminate) with reference to FIGS. 7 and 8 which are views of steps.

The composite sheet of the above embodiment is preferably used for the production of a ceramic board (laminate) of a multi-layer structure having, for example, a portion of a low dielectric constant.

Referring to FIG. 7(a), there are prepared composite sheets A1 and A2 having a low dielectric portion 7" formed by burying the sheet of a low dielectric constant in the through hole by the step of FIG. 1 or FIG. 2, and ceramic green sheets B1, B2 and B3 which have not been compounded.

Metallizing layers are suitably printed on the surfaces of the composite sheets A1, A2 and on the surfaces of the ceramic green sheets B1 to B3.

In particular, signal conductors 8a and ground conductors 8b are formed with low dielectric portions 7" held therebetween thereby to form high-frequency transmission lines such as microstrip lines or triplet lines.

Further, through holes may be formed in the composite sheets A1, A2 and in the ceramic green sheets B1 to B3, and may be filled with a metal paste to form via conductors 9. The metallized layers 8 formed on the different layers can be electrically connected together using the via conductors 9.

These composite sheets A1, A2 and the ceramic green sheets B1 to B3 are laminated with their positions being in match to produce a composite laminate C.

Thereafter, the composite laminate C is fired at a temperature at which all ceramics become dense, thereby to form a multi-layered ceramic board having a high-frequency transmission line formed by low dielectric portions 7" as shown in FIG. 7(b).

According to the third invention, the composite sheets can be preferably used for producing a ceramic board of a multi-layer structure having, for example, high dielectric portions.

A method of producing the ceramic board will now be described with reference to FIG. 8 which is a view of steps.

Referring to FIG. 8(a), there are prepared a composite sheet A3 having a high dielectric portion 10 formed by burying a sheet of a high dielectric constant in the through hole, and ceramic green sheets B4, B5, B6 and B7 which have not been compounded.

Metallized layers 8 are suitably printed on the surfaces of the composite sheet A3 and of the ceramic green sheets B4 to B7.

In particular, a pair of electrodes 8c and 8d are formed with the high dielectric portion 10 interposed therebetween to thereby form a capacitor portion.

Further, through holes are formed in the composite sheet A1 and in the ceramic green sheets B4 to B7, and are filled with a metal paste to form via conductors 9. The metallized layers 8 formed on the different layers can be electrically connected together using the via conductors 9.

These composite sheet A1 and the ceramic green sheets B4 to B7 are laminated with their positions being in match to produce a composite laminate D.

Thereafter, the composite laminate D is fired at a temperature at which all ceramics become dense, thereby to form a multi-layered ceramic board having a capacitor portion formed by the high dielectric portion 10 as shown in FIG. 8(b).

According to the above method, there exists no portion which is soft and has a density that is greatly different such as of the paste-filled portion in the sheet that is being compounded unlike that of the prior art. Therefore, it becomes very easy to handle the composite sheet formed by two kinds of different sheets, and the sheets are not deformed or broken when being handled.

In the present invention, further, the density of the green sheets can be easily controlled in integrally laminating the green sheets. It is therefore allowed to form composite sheets having relative densities which are close to each other and to form a composite laminate.

At the time of forming the composite laminate, it is desired to apply a pressure of 500 to 1000 MPa or greater from the standpoint of preventing the occurrence of defective lamination or delamination after firing.

EXAMPLE 1

(Preparation of a First Ceramic Sheet)

To 100 parts by mass of a ceramic composition comprising 60% by volume of a glass powder having an average particle size of 1.8 µm and 40% by volume of an alumina powder having an average particle size of 2.4 µm, there were added 12 parts by mass of a polyisobutyl methacrylate as an organic binder and 54 parts by mass of toluene as a solvent. The mixture was mixed together with a ball mill for 24 hours to prepare a slurry thereof.

By using this slurry, a first ceramic sheet A measuring 20 mm long, 20 mm wide and 120 µm thick was prepared by the doctor blade method.

A metal paste was prepared by mixing 100 parts by mass of a copper powder having an average particle size of 1.5 µm, 12 parts by mass of an acrylic resin as an organic binder and 10 parts by mass of terpineol as a solvent, and was applied onto the surface of the first ceramic green sheet A in a predetermined pattern by the screen-printing method.

Further, through holes of a diameter of 70 µm were formed in the first ceramic sheet A sby pinning, and were filled with the above metal paste to form via conductors.

(Preparation of a Resin Sheet)

100 Parts by mass of acrylic resin beads having an average particle size of 5 µm, 60 parts by mass of an acrylic resin to which a hydroxyl group is introduced as an organic binder, and 220 parts by mass of toluene as a solvent, were mixed together to prepare a slurry thereof, from which a sheet of a thickness of 120 µm was prepared by the doctor blade method.

Then, a through hole measuring 2.2 mm long and 3 mm wide was formed in the central portion of the first ceramic sheet A by using the punching device shown in FIG. 1.

Next, a resin sheet B to which is applied an adhesive obtained by adding a plasticizer to the acrylic resin, was laminated on the first ceramic sheet A in which the through hole has been formed, by using an adsorptive carrier device. Then, the upper punch of the punching device was lowered until the lower surface of the upper punch was in flush with the surface of the first ceramic sheet A.

The upper punch was raised, and it was confirmed that there had been formed a composite sheet C1 of a structure with the resin sheet being buried in the through hole of the first ceramic sheet A.

Next, a total of five layers of green sheets were laminated by using an adhering solution, i.e., there were laminated the composite sheet C1 prepared as described above, a composite sheet C2 prepared in the same manner as described above and in which a resin sheet is buried in the through hole thereof, and ceramic green sheets D1, D2 and D3 on which an ordinary wiring pattern has been formed but which have not been compounded.

In laminating the layers, the laminate was heated at a temperature of 60° C. under a pressure of 5 MPa.

The thus press-laminated sample was observed for its deformation of the ceramic green sheet at the portion where the resin sheet was buried. However, no deformation of the ceramic green sheet was recognized.

Next, the laminate was heated in a nitrogen atmosphere of 250 to 450° C. for 2 hours to remove the resin sheet and the organic binder by the heat decomposition, and was, then, heated up to 900° C. to sinter the ceramic green sheets.

As a result, there was obtained a ceramic wiring board (composite laminate) forming a cavity as a result of thermally decomposing the resin sheet that had been buried.

The obtained ceramic wiring substrate was measured for its flatness of the bottom surface of the cavity by a probing method to be 0.8 µm. It was confirmed that there had been formed a highly flat bottom surface without almost any deformation.

Further, the portion forming the cavity was cut, and the state of the laminate portion was observed through a binocular microscope to make sure that the layers had not been peeled at all.

EXAMPLE 2

The first ceramic sheet A and the resin sheet B prepared in Example 1 were laminated as shown in FIG. 2. Then, the upper punch of the punching device was lowered until the lower surface of the upper punch was in flush with the surface of the sheet A.

The upper punch was raised, and it was confirmed that there had been formed a composite sheet C3 of a structure with the resin sheet B being buried in the through hole of the first ceramic sheet A.

Next, a total of five layers of green sheets were laminated in quite the same manner as in Example 1 by using an adhering solution, i.e., the composite sheet C3, a composite sheet C4 prepared in the same manner as C3, and ceramic green sheets D1, D2 and D3 on which an ordinary wiring pattern has formed but which have not been compounded, and the laminate was heated at a temperature of 60° C. under a pressure of 5 MPa.

The thus press-laminated sample was observed for its deformation of the ceramic green sheet at the portion where the resin sheet was buried. However, no deformation of the ceramic green sheet was recognized.

Next, the laminate-was heated in a nitrogen atmosphere of 250 to 450° C. for 2 hours to remove the resin sheet and the organic binder by the heat decomposition, and was, then, heated up to 900° C. to sinter the ceramic green sheets. As a result, there was obtained a ceramic wiring board forming a cavity as a result of thermally decomposing the resin sheet that had been buried.

The thus obtained ceramic wiring board was measured for its flatness of the bottom surface of the cavity a probing method to be 1 µm. It was confirmed that there had been formed a highly flat bottom surface without almost any deformation.

Further, the portion forming the cavity was cut, and the state of the laminate portion was observed through a binocular microscope to make sure that the layers had not been peeled at all.

COMPARATIVE EXAMPLE 1

Through holes were formed in the first ceramic sheets A1 and A2 prepared in the same manner as in Example 1, but were not buried with the resin sheet.

A total of five layers of green sheets were laminated by using an adhering solution, i.e., the first ceramic sheets A1, A2 together with the ceramic green sheets D1, D2 and D3 without through holes used in Examples 1 and 2, were laminated at a temperature of 60° C. under a pressure of 5 MPa.

The thus press-laminated sample was observed for its deformation of the ceramic green sheets at the portion of cavity corresponding to the portion where the resin sheet has been buried in Examples. As a result, there was confirmed a swollen bottom surface of the cavity in the ceramic green sheets.

Next, the laminate was heated in a nitrogen atmosphere of 250 to 450° C. for 2 hours to remove the organic binder by heat decomposition, and was, then, heated up to 900° C. to sinter the ceramic green sheets. As a result, there was obtained a ceramic wiring board forming a cavity.

The thus obtained ceramic wiring board was measured for its flatness of the bottom surface of the cavity by a probing method to be 6 μm. It was confirmed that there had been formed a poorly flat bottom surface and the board had been deformed.

Further, the portion forming the cavity was cut, and the state of the laminate portion was observed through a binocular microscope to make sure that the layers had not been peeled at all.

COMPARATIVE EXAMPLE 2

A ceramic wiring board having a cavity was produced in quite the same manner as in Comparative Example 1 but laminating a total of five layers of ceramic green sheets by using an adhering solution, i.e., by laminating the first ceramic sheets A1, A2 in which the through holes have simply been formed together with the ceramic green sheets D1, D2 and D3 without through holes used in Examples 1 and 2, at a temperature of 60° C. under a pressure of 2 MPa which was lower than that of Comparative Example 1.

The thus obtained ceramic wiring board was measured for its flatness of the bottom surface of the cavity by a probing method to be 2 μm. Thus, there had been formed a bottom surface having a relatively good flatness and no deformation of the board was recognized. However, observation of the state of the laminated portion by cutting the cavity-forming portion showed the occurrence of peeling among the layers.

EXAMPLE 3

To 100 parts by mass of a ceramic composition comprising 60% by mass of a carbon powder having an average particle diameter of 40 μm and 40% by mass of a butyral resin having a glass transition point of 60° C., there was added 150 parts by mass of toluene and then the components were mixed.

Then, the mixture was stirred with a ball mill to prepare a slurry.

The slurry was deformed by stirring under reduced pressure, and then using the deformed slurry, there was formed a burn-and-extinguish sheer having 200 μm thickness by doctor-blade method.

A ceramic wiring substrate having a cavity was prepared quite the same manner as Example 1 except that the above mentioned carbon sheet was used instead of a resin sheet as a burn-and-extinguish sheet.

In the preparation steps, the press-laminated sample was observed for its deformation of the ceramic green sheet at the portion where the burn-and-extinguish sheet (carbon sheet) was buried.

However, no deformation of the ceramic green sheet was recognized.

The obtained ceramic wiring substrate was measured for its flatness of the bottom surface of the cavity by a probing method to be 0.9 μm.

It was confirmed that there had been formed a highly flat bottom surface without almost any deformation.

Further, the portion forming the cavity was cut, and the state of the laminate portion was observed through a binocular microscope to make sure that the layers had been peeled at all.

EXAMPLE 4

(Preparation of a First Ceramic Sheet)

To an aluminum oxide powder (average particle size of 1.8 μm) were added 5% by weight of $MnO_2$, 3% by weight of $SiO_2$ and 0.5% by weight of MgO, followed by the addition of 3% by weight of an acrylic resin as an organic resin for molding, and toluene as a solvent. The mixture was mixed by using a ball mill for 24 hours to prepare a slurry thereof.

By using this slurry, a green sheet (first ceramic sheet) measuring 300 mm long, 300 mm wide and 230 μm thick was prepared by the doctor blade method.

A metal paste was prepared by mixing 50% by volume of a copper powder having an average particle size of 3 μm, 50% by volume of a tungsten powder having an average particle size of 2 μm, 4% by mass of an acrylic binder as an organic resin for printing and 10% by mass of dibutyl phthalate as a plasticizer, and was applied onto the surface of the above first ceramic sheet in a predetermined pattern by the screen-printing method.

Further, through holes of a diameter of 120 μm were formed in the first ceramic sheet by using a micro-drill and were filled with the above metal paste to form via conductors.

(Preparation of a Metal Sheet)

To 50% by volume of a copper powder having an average particle size of 3 μm, there were added 50% by volume of a tungsten powder having an average particle size of 2 μm, 2% by mass of an acrylic resin as an organic resin for molding and toluene as a solvent. The mixture was mixed by using a ball mill for 24 hours to prepare a slurry thereof.

By using the slurry, a metal sheet measuring 300 mm long, 300 mm wide and 230 μm thick was prepared by the doctor blade method.

(Preparation of a Laminate)

Next, a through hole measuring 10 mm long and 30 mm wide was formed in the central portion of the first ceramic sheet 1 by using the punching device shown in FIG. 1.

Next, the metal sheet 2 was laminated on the first ceramic sheet 1 in which the through hole has been formed, and the upper punch of the punching device was lowered until the lower surface of the upper punch was in flush with the surface of the first ceramic sheet 1.

The upper punch was raised, and it was confirmed that there had been formed a composite sheet A of a structure with the metal sheet 2 being buried in the through hole of the first ceramic sheet 1.

Next, as shown in FIG. 6, a total of five layers of green ceramic sheets were laminated by using an adhering solution, i.e., there were laminated the composite sheet A1 prepared as described above, a composite sheet A2 prepared in the same manner as described above and in which a metal sheet has been buried in the through hole thereof, and ceramic green sheets B1, B2 and B3 on which an ordinary wiring pattern has been formed but which have not been compounded with the metal sheet.

In laminating the layers, the laminate was heated at a temperature of 60° C. under a pressure of 900 MPa.

The thus pres-laminated sample was observed for its deformation of the green ceramic sheet at the portion where the metal sheet was buried. However, no deformation of the ceramic green sheet was recognized.

Next, the laminate was heated in a reducing atmosphere of 1350° C. for 20 hours to effect the sintering.

As a result, there was obtained a ceramic wiring board having a metal layer in the portion where the metal sheet was buried.

The thus obtained ceramic wiring board was measured for its flatness of the metal layer surface by a probing method to find a maximum difference of height of 30 µm/10 mm. It was confirmed that there had been formed a highly flat board without almost any deformation.

Further, the portion forming the metal layer was cut, and the vicinity of the metal layer was observed through a binocular microscope to make sure that the layers had not been peeled and the defective filling had not occurred at all.

EXAMPLE 5

The first ceramic sheet 1 and the metal sheet 2 prepared in Example 4 were laminated as shown in FIG. 2. Then, the upper punch of the punching device was lowered until the lower surface of the upper punch was in flush with the surface of the first ceramic sheet 1.

The upper punch was raised, and it was confirmed that there had been formed a composite sheet A' of a structure with the metal sheet 2 being buried in the through hole of the first ceramic sheet 1.

Next, a total of five layers of sheets were laminated in quite the same manner as in Example 4 by using an adhering solution, i.e., the composite sheets A1, A2 and ceramic green sheets B1, B2 and B3 on which an ordinary wiring pattern has been formed were laminated as shown in FIG. 6, and the laminate was heated at a temperature of 60° C. under a pressure of 900 MPa.

The thus press-laminated sample was observed for its deformation of the ceramic sheet at the portion where the metal sheet was buried. However, no deformation of the ceramic sheet was recognized.

Next, the laminate was heated in a reducing atmosphere of 1350° C. for 20 hours to effect the sintering. As a result, there was obtained a ceramic wiring board having a metal layer in a portion where the metal sheet had been buried.

The obtained ceramic wiring board was measured for its flatness of the surface of the metal layer by a probing method to find a maximum difference of height of 40 µm/10 mm or smaller like in Example 4. It was confirmed that there had been formed a highly flat board without almost any deformation. Further, the portion of the metal layer was cut, and the vicinity of the metal layer was observed through a binocular microscope to make sure that the layers had not been peeled or the defective filling had not occurred at all.

COMPARATIVE EXAMPLE 3

Through holes were formed in the first ceramic sheets A1 and A2 prepared in the same manner as in Example 4, but were not buried with the metal sheet. The sheets with the through hole were laminated on the surfaces on the one side only (sheets A1 and B1, and sheets A2 and B2) to form a recessed portion.

The recessed portion was filled with the metal paste described in Example 4 by the screen-printing method, and the sheets were dried at 60° C. for 60 minutes. Five layers of sheets were laminated by using an adhering solution, i.e., the laminates of the sheets A1 and B1, and A2 and B2 together with the green sheet B3 at a temperature of 60° C. under the a pressure of 900 MPa.

The thus press-laminated sample was observed for its deformation at the portion filled with the metal paste. As a result, there was confirmed a dent in the surface of the metal paste.

Next, the laminate was heated in a reducing atmosphere of 1350° C. for 20 hours to effect the sintering. As a result, there was obtained a ceramic wiring board forming a metal layer.

The obtained ceramic wiring board was measured for its flatness of the surface of the metal layer by a probing method to find a maximum difference of height of 150 µm/10 mm. It was confirmed that there had been formed a poorly flat metal layer and the board had been deformed.

Further, the portion forming the metal layer was cut, and the vicinity of the metal layer was observed through a binocular microscope to find a gap formed in the interface between the insulating board and the metal layer probably due to defective filling.

EXAMPLE 6

(Preparation of a First Ceramic Sheet)

To an alumina powder (average particle size of 1.8 µm) were added 5% by mass of $MnO_2$, 3% by mass of $SiO_2$ and 0.5% by mass of MgO.

To 100 parts by mass of the ceramic powder were added 10 parts by mass of an acrylic binder as an organic resin (binder) for molding, and toluene as a solvent. The mixture was mixed by using a ball mill for 24 hours to prepare a slurry thereof.

By using this slurry, an alumina green sheet (first ceramic sheet) 1 measuring 300 mm long, 300 mm wide and 230 µm thick and having a dielectric constant capacitance $\epsilon=10$ was prepared by the doctor blade method.

The sheet was measured for its relative density by the Archimedes's method to be 52%.

Further, a metal paste was prepared by mixing 86% by mass of a tungsten powder having an average particle size of 2 µm, 4% by mass of an acrylic binder as an organic resin for printing, and 10% by mass of a dibutyl phthalate as a plasticizer, and was applied onto the surface of the first ceramic sheet in a predetermined pattern by the screen-printing method.

Further, through holes of a diameter of 120 µm were formed in the first ceramic sheet by using amicro-drill and were filled with the above metal paste to form via conductors.

(Preparation of a Second Ceramic Sheet)

To 60% by mass of a forsterite powder having an average particle size of 3 µm, there was added 40% by mass of a cordierite powder having an average particle size of 3 µm.

To 100 parts by mass of the ceramic powder, there were added 12 parts by mass of an acrylic binder as an organic resin for molding, and toluene as a solvent. The mixture was mixed for 24 hours by using a ball mill to prepare a slurry thereof.

By using the slurry, a second ceramic sheet 2 measuring 300 mm long, 300 mm wide and 230 µm thick and having a dielectric constant capacitance $\epsilon=6$ was prepared by the doctor blade method.

The second ceramic sheet 2 was measured for its relative density by the Archimedes's method to be 53%.

(Preparation of a Laminate)

Next, a through hole measuring 10 mm long and 30 mm wide was formed in the central portion of the first ceramic sheet 1 by using the punching device shown in FIG. 1.

Next, the second ceramic sheet 2 was laminated on the first ceramic sheet 1 in which the through hole has been formed, and the upper punch of the punching device was lowered until the lower surface of the upper punch was in flush with the surface of the first ceramic sheet 1.

The upper punch was raised, and it was confirmed that there had been formed a composite sheet A of a structure with the second ceramic green sheet 2 being buried in the through hole of the first ceramic green sheet 1.

Figure 7:
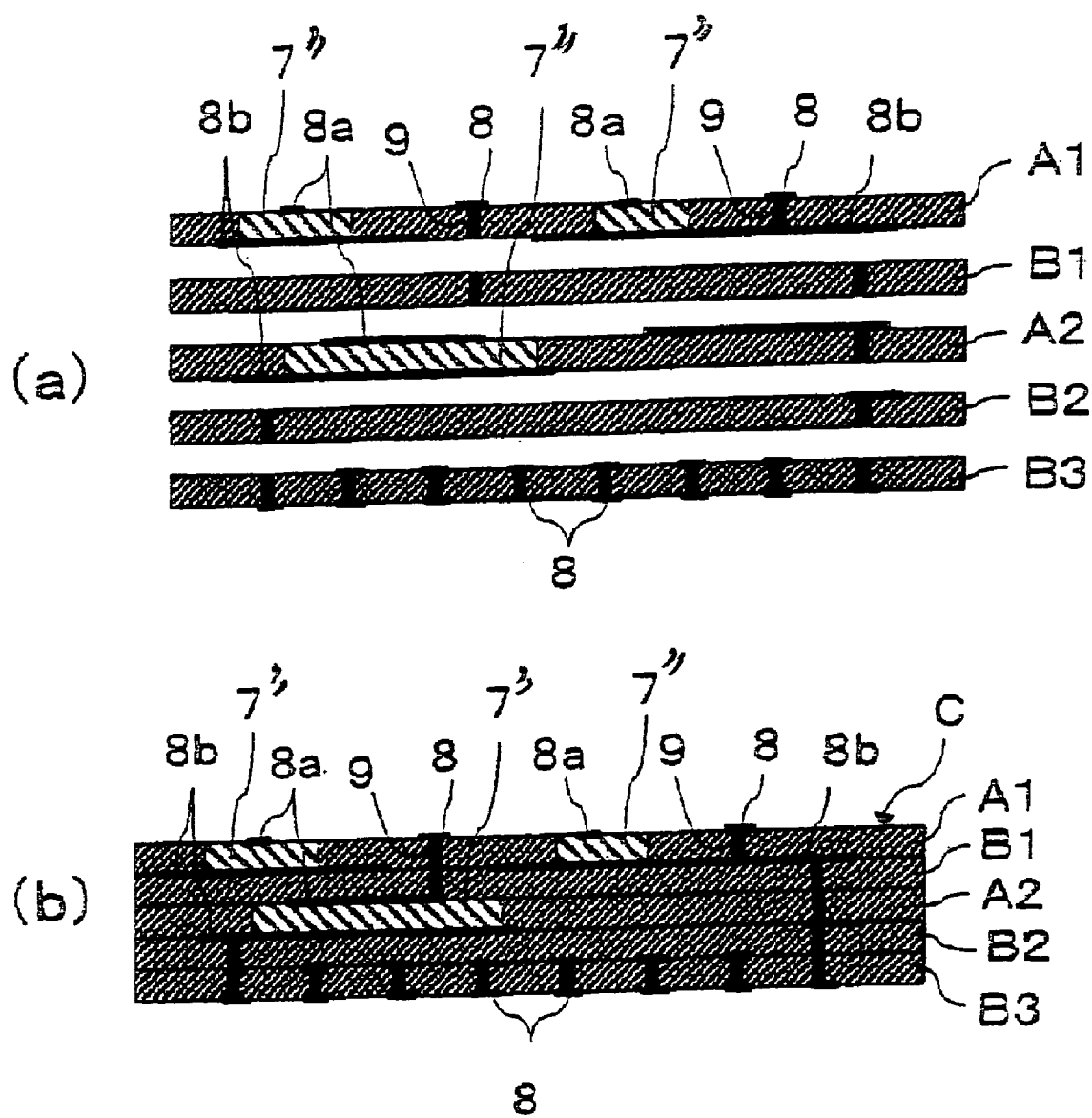
FIG. 7 is a view of steps illustrating a method of producing a laminate having a layer of a low dielectric constant by using the composite sheet of the invention.

Next, as shown in FIG. 7, a total of five layers of sheets were laminated by using an adhering solution, i.e., there were adhered the composite sheet A1 prepared as described above, a composite sheet A2 prepared in the same manner as described above and in which the second ceramic sheet has been buried in the through hole thereof, and ceramic green sheets B1, B2 and B3 on which an ordinary wiring pattern has been formed but which have not been compounded with the second ceramic sheet, to thereby prepare a composite laminate. In laminating the layers, the composite laminate was heated at a temperature of 60° C. under a pressure of 900 MPa.

The thus produced composite laminate was observed for its deformation of the sheets at the portion where the second ceramic sheet was buried. However, no deformation was recognized at all.

Further, observation of the cross section did not at all show peeling among the sheets in the portion where the second ceramic sheet has been buried.

Next, the laminate was heated in a reducing atmosphere of 1350° C. for 20 hours to effect the sintering.

As a result, there was obtained a ceramic wiring board having a metallized wiring layer in the portion of a low dielectric constant where the second ceramic sheet was buried.

The obtained ceramic wiring board was measured for its flatness of the surface of the portion of the low dielectric constant by a probing method to find a maximum difference of height of 50 μm/10 mm. Thus, it was confirmed that there had been formed a highly flat board without almost any deformation. Further, the portion of the low dielectric constant was cut, and the vicinity of the low dielectric portion was observed through a binocular microscope to make sure that the layers had not been peeled and the defective filling had not occurred at all.

The reflection loss of the wiring board at a frequency of 10 GHz was evaluated by using a network analyzer and a wafer probe. When the wiring board was formed by using the first ceramic sheets only, the reflection loss was −10 dB. By forming the low dielectric portion, however, it was confirmed that the reflection loss was decreased down to −20 dB.

EXAMPLE 7

(Preparation of a Green Sheet)

To 60% by mass of a diopside-containing crystalline glass powder(average particle size of 1.8 μm) were added 30% by mass of alumina, 5% by mass of MnO$_2$ and 5% by mass of MgO.

To 100 parts by mass of the ceramic powder were added 3 parts by mass of an acrylic binder as an organic resin for molding, and toluene as a solvent. The mixture was mixed by using a ball mill for 24 hours to prepare a slurry thereof.

By using this slurry, a first ceramic sheet 1 measuring 300 mm long, 300 mm wide and 230 μm thick and having a dielectric constant capacitance ∈=9 was prepared by the doctor blade method.

The first ceramic sheet 1 was measured for its relative density by the Archimedes's method to be 55%.

Further, a metal paste was prepared by mixing 100% by volume of a copper powder having an average particle size of 3 μm, 5% by volume of a glass powder having an average particle size of 2 μm, 4% by mass of an acrylic binder as an organic resin for printing, and 10% by mass of a dibutyl phthalate as a plasticizer, and was applied onto the surface of the above green sheet in a predetermined pattern by the screen-printing method.

Further, through holes of a diameter of 120 μm were formed in the green sheet by using a micro-drill and were filled with the above metal paste to form via conductors.

(Preparation of a Second Ceramic Sheet)

To 40% by mass of a silica powder having an average particle size of 3 μm, there was added 30% by mass of a cordierite powder having an average particle size of 3 μm and 30% by mass of a borosilicate glass powder.

To 100 parts by mass of the ceramic powder, there were added 12 parts by mass of an acrylic binder as an organic resin for molding, and toluene as a solvent. The mixture was mixed for 24 hours by using a ball mill to prepare a slurry thereof.

By using the slurry, a second ceramic sheet 2 measuring 300 mm long, 300 mm wide and 230 μm thick and having a dielectric constant capacitance ∈=5 was prepared by the doctor blade method.

The sheet 2 was measured for its relative density by the Archimedes' method to be 54%.

(Preparation of a Laminate)

Next, a through hole measuring 10 mm long and 30 mm wide was formed in the central portion of the first ceramic sheet 1 by using the punching device shown in FIG. 1.

Next, the second ceramic sheet 2 was laminated on the first ceramic sheet 1 in which the through hole has been formed, and the upper punch of the punching device was lowered until the lower surface of the upper punch was in flush with the surface of the first ceramic sheet 1.

The upper punch was raised, and it was confirmed that there had been formed a composite sheet A of a structure with the second ceramic green sheet 2 being buried in the through hole of the first ceramic sheet 1.

Next, as shown in FIG. 7, a total of five layers of sheets were laminated by using an adhering solution, i.e., there were laminated the composite sheet A1 prepared as described above, a composite sheet A2 prepared in the same manner as described above and in which the second ceramic sheet has been buried in the through hole thereof, and ceramic green sheets B1, B2 and B3 on which an ordinary wiring pattern has been formed.

In laminating the layers, the laminate was heated at a temperature of 60° C. under a pressure of 800 MPa.

The thus produced composite laminate was observed for its deformation of the sheets at the portion where the second ceramic sheet was buried. However, no deformation of sheets was recognized at all.

Further, observation of the cross section did not at all show peeling among the sheets in the portion where the second ceramic sheet has been buried.

Next, the laminate was heated in a reducing atmosphere of 950° C. for 2 hours to effect the sintering.

As a result, there was obtained a glass ceramic wiring board having a metallized wiring layer in the portion of a low dielectric constant where the second ceramic sheet was buried.

The obtained glass ceramic wiring board was measured for its flatness of the surface of the dielectric layer a probing method to find a maximum difference of height of 50 μm/10 mm. Thus, it was confirmed that there had been formed a highly flat board without almost any deformation.

Further, the portion of the low dielectric constant was cut, and the vicinity of the low dielectric portion was observed through a binocular microscope to make sure that the layers had not been peeled and the defective filling had not occurred at all.

The reflection loss of the wiring board at a frequency of 10 GHz was evaluated in the same manner as in Example 6. When the wiring board was formed by using the first ceramic sheets only, the reflection loss was −15 dB. By forming the low dielectric portion, however, it was confirmed that the reflection loss was decreased down to −25 dB.

EXAMPLE 8

The first ceramic sheet 1 and the second ceramic sheet 2 prepared in Example 6 were laminated as shown in FIG. 2. Then, the upper punch of the punching device was lowered until the lower surface of the upper punch was in flush with the surface of the first ceramic sheet 1.

The upper punch was raised, and it was confirmed that there had been formed a composite sheet A' of a structure with the second ceramic sheet 2 being buried in the through hole of the first ceramic sheet 1.

Next, as shown in FIG. 7, a total of five layers of sheets were laminated in quite the same manner as in Example 6 by using an adhering solution, i.e., there were laminated the composite sheets A1, A2 and the ceramic green sheets B1, B2 and B3 on which an ordinary wiring pattern has been formed, to thereby produce a composite laminate. The laminate was heated at a temperature of 60° C. under a pressure of 800 MPa.

The ceramic wiring board obtained by firing the composite laminate in the same manner as in Example 6 was observed for its deformation and peeling of layers. As a result, neither the composite laminate of before being fired nor the ceramic wiring board showed deformation or peeling among the layers.

The flatness of the surface just on the portion of a low dielectric constant was measured by a probing method to find a maximum difference of height of 50 μm/10 mm or smaller like in Example 6. It was confirmed that there had been formed a highly flat board without almost any deformation. Further, the transmission characteristics were nearly the same as those of Example 6.

EXAMPLE 9

A similar wiring board was produced by using the following material of a high dielectric constant as a second ceramic sheet for the first ceramic sheet prepared in Example 6.

(Preparation of a Second Ceramic Sheet)

To an alumina powder (average particle size of 1.8 μm) were added 5% by mass of $MnO_2$, 3% by mass of $SiO_2$, 0.5% by mass of MgO and 10% by mass of metal molybdenum, followed by the addition of 10% by mass of an acrylic binder as an organic resin for molding and toluene as a solvent. The mixture was mixed by using a ball mill for 24 hours to prepare a slurry thereof.

By using this slurry, a second ceramic sheet A3 measuring 300 mm long, 300 mm wide and 230 μm thick and having a dielectric constant capacitance $\in=20$ was prepared by the doctor blade method.

The sheet A3 was measured for its relative density by the Archimedes's method to be 52%.

Figure 8:
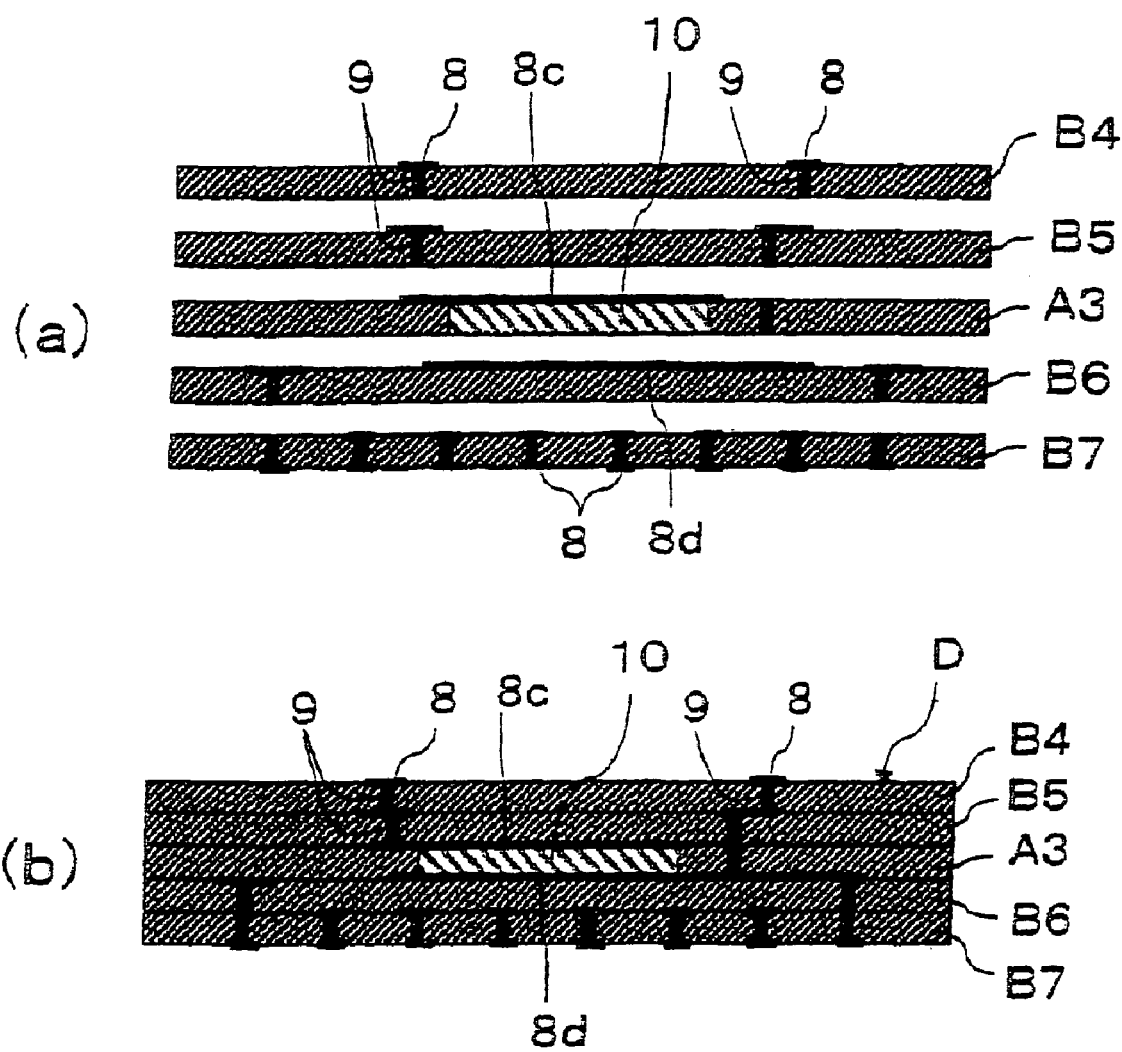
FIG. 8 is a view of steps illustrating a method of producing a laminate having a layer of a high dielectric constant by using the composite sheet of the invention.
Figure 9:
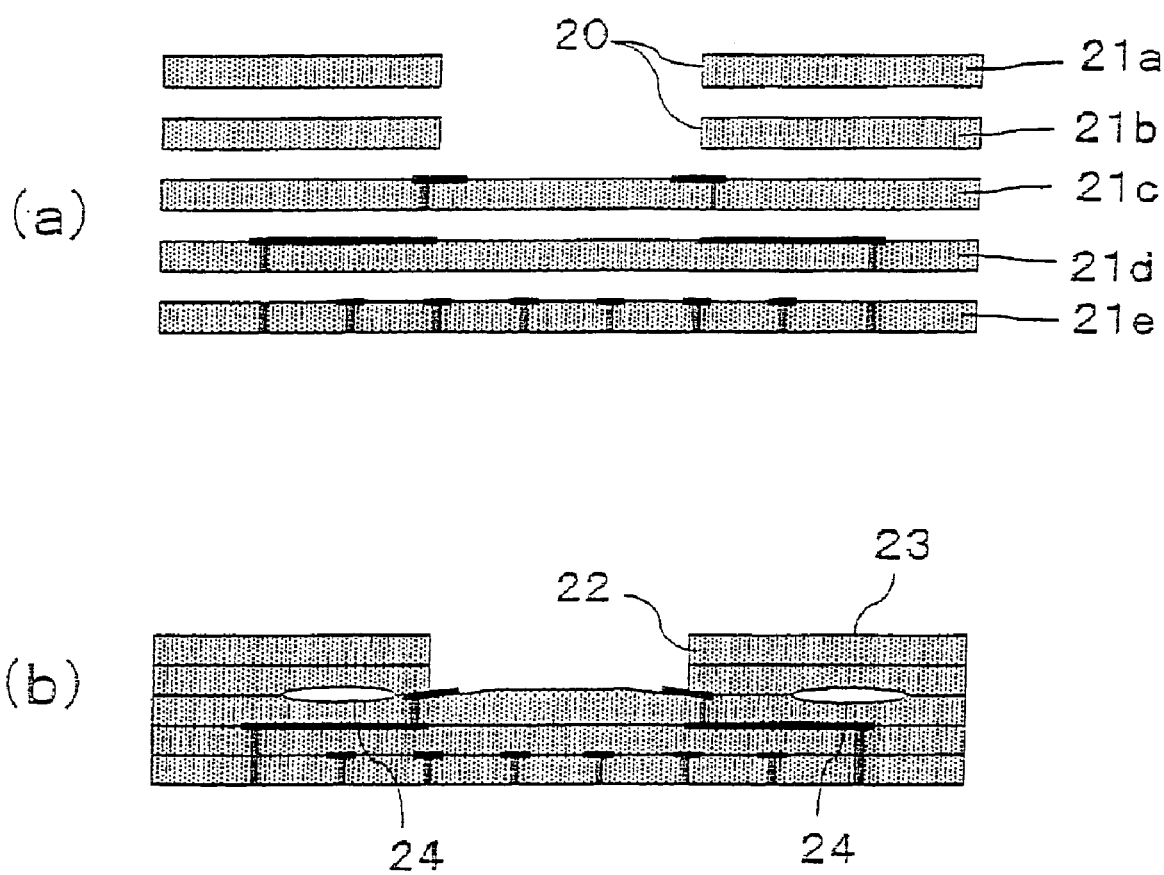
FIG. 9 is a view of steps illustrating a conventional method of producing a ceramic laminated board having a cavity.

Next, as shown in FIG. 8, a total of five layers of sheets were laminated by using an adhering solution, i.e., the composite sheet A3 and the ceramic green sheets B4, B5, B6 and B7 on which an ordinary wiring pattern has been formed. The laminate was heated at a temperature of 60° C. under a pressure of 900 MPa.

By using a conductive paste, electrodes 8c and 8d were printed on the portion of the high dielectric constant in the composite sheet A3.

The thus press-laminated sample was observed for its deformation of the first ceramic sheet at the portion where the second ceramic sheet was buried. However, no deformation of the first ceramic sheet was recognized at all like in Example 6.

Further, observation of the cross section did not at all show peeling among the sheets in the portion where the second ceramic sheet has been buried.

Next, the laminate was heated in a reducing atmosphere of 1350° C. for 20 hours to effect the sintering. As a result, there was obtained a ceramic wiring board containing a capacitor holding the high dielectric portion by the electrodes 8c and 8d.

The obtained ceramic wiring board containing a capacitor was measured for its flatness of the surface of the portion forming the capacitor by a probing method to find a maximum difference of height of 50 μm/10 mm or smaller. Thus, it was confirmed that there had been formed a highly flat board without almost any deformation.

Further, the portion of the high dielectric constant was cut, and the vicinity of the high dielectric portion was observed through a binocular microscope to make sure that the layers had not been peeled and the defective filling had not occurred at all.

EXAMPLE 10

A composite sheet was prepared by the method shown in FIG. 1 by forming, as the first ceramic sheet, the ceramic green sheet of alumina used in Example 4 and by forming the copper/tungsten alloy sheet that was also used in Example 4.

While the composite sheet was still in the state of a green sheet, a solvent 17 of butyl carbitol acetate (BCA) was applied in small amounts onto the boundary portion between the first sheet 1 and the different kind of sheet 2a in the composite sheet while moving a fine tube along the boundary portion so as to infiltrate into the boundary portion and to swell the boundary portion(see FIG. 3(ii)).

Next, the swollen composite sheet A' was pressed with a pressure of 5 MPa in the direction of thickness to integrate the first sheet and the different kind of sheet together by removing a gap.

By using the composite sheets that have been swollen, a green sheet laminate was produced according to the method shown in FIG. 6 in the same manner as in Example 4.

The sample of laminate was observed for the deformation of the first ceramic sheet in the portion where the metal sheet has been buried. As a result, no deformation of the first ceramic sheet was at all recognized.

Next, the laminate was sintered under the same conditions as those of Example 4.

As a result, there was obtained a ceramic wiring board having a metal layer in the portion where the second sheet (different kind of sheet) has been buried.

The obtained ceramic wiring board was measured for its flatness of the surface of the metal layer by a probing method to find a maximum difference of height of 30 μm/10 mm. It was confirmed that the boundary between the two sheets were smoothly continuing, and there had been formed a highly flat board inclusive of the boundary portion without almost any deformation.

Further, the portion of the metal layer was cut, and the vicinity of the metal layer was observed through a binocular microscope to make sure that the layers had not been peeled and the defective filling or the defective connection had not occurred at all.

EXAMPLE 11

A composite sheet that has been swollen, a green laminate and a fired laminate (ceramic wiring board) were prepared in quite the same manner as in Example 10 but forming the composite green sheet by treating the first ceramic sheet and the metal sheet by the method shown in FIG. 2 (second invention).

The sample of the green laminate was observed for the deformation of the first ceramic sheet in the portion where the metal sheet has been buried. As a result, no deformation of the first ceramic sheet was at all recognized.

Further, the ceramic wiring board was measured for its flatness of the surface of the metal layer by a probing method to find a maximum difference of height of 40 μm/10 mm. It was confirmed that the boundary portion between the two sheets were smoothly continuing, and there had been formed a highly flat board inclusive of the boundary portion without almost any deformation.

Further, the portion of the metal layer was cut, and the vicinity of the metal layer was observed through a binocular microscope to make sure that the layers had not been peeled and the defective filling or the defective connection had not occurred at all.

EXAMPLE 12

A first ceramic sheet was prepared in the same manner as in Example 4 but changing the amount of the acrylic resin (organic resin for molding) that is blended at the time of forming the first ceramic sheet from 3% by weight to 10% by weight. A patterned conductor and via conductors were formed in the first ceramic sheet in the same manner as in Example 4.

As a different kind of sheet, there was formed quite the same copper/tungsten metal sheet as that of Example 4.

Separately, to an aluminum oxide powder (average particle size of 1.8 μm) were added 5% by weight of $MnO_2$, 3% by weight of $SiO_2$ and 0.5% by weight of MgO, followed by the addition of 3% by weight of an acrylic resin and acetone as a solvent.

The mixture was mixed by using a ball mill for 24 hours to prepare a slurry thereof. The solvent therein was volatilized to prepare a paste for a coating layer.

Then, a composite green sheet was formed by treating the first ceramic sheet and the metal sheet by the method shown in FIG. 1, and the above paste for the coating layer was printed on the junction interface between the first ceramic sheet and the metal sheet to obtain a composite sheet having a coating layer 10 shown in FIG. 4(*ii*).

Next, as shown in FIG. 6, a total of five layers of sheets were laminated by using an adhering solution, i.e., the composite sheet A1 prepared as described above, a composite sheet A2 prepared in the same manner as described above and in which the metal sheet has been buried in the through hole thereof, and the first ceramic sheets B1, B2 and B3 on which an ordinary wiring pattern has been formed.

In laminating the layers, the laminate was heated at a temperature of 60° C. under a pressure of 900 MPa.

The thus press-laminated sample was observed for its deformation of the sheets at the portion where the metal sheet was buried. However, no deformation of the sheet was recognized at all.

Next, the laminate was heated in a reducing atmosphere of 1350° C. for 20 hours to effect the sintering.

As a result, there was obtained a ceramic wiring board (fired laminate) having a metal layer in the portion where the metal sheet was buried.

The obtained ceramic wiring board was measured for its flatness of the surface of the metal layer a probing method to find a maximum difference of height of 30 μm/10 mm. Thus, it was confirmed that there had been formed a highly flat board without almost any deformation.

Further, the portion of the metal layer was cut, and the vicinity of the metal layer was observed through a binocular microscope to make sure that the layers had not been peeled and the defective filling had not occurred at all.

Further, a layer was plated on the surface of the wiring board, and a high-temperature/high-humidity bias testing was conducted to evaluate the reliability. After the testing, the junction interface was examined to make sure that no migration or corrosion took place.

EXAMPLE 13

A pressed green laminate and a fired laminate (ceramic wiring board) were produced in quite the same manner as in Example 11 but forming a composite sheet by treating the first ceramic sheet and the metal sheet by the method shown in FIG. 2.

The press-laminated green sample was observed for its deformation of of the ceramic green sheet at the portion where the metal sheet was buried. As a result, no deformation of the sheet was recognized at all like in Example 12.

The obtained fired laminate (ceramic wiring board) was measured for its flatness of the surface of the metal layer by a probing method to find a maximum difference of height of 40 μm/10 mm or smaller like in Example 12. Thus, it was confirmed that there had been formed a highly flat board without almost any deformation.

Further, the portion of the metal layer was cut, and the vicinity of the metal layer was observed through a binocular microscope to make sure that the layers had not been peeled and the defective filling had not occurred at all.

Further, a layer was plated on the surface of the wiring board, and a high-temperature/high-humidity bias testing was conducted to evaluate the reliability. After the testing, the junction interface was examined to make sure that no migration or corrosion took place.

EXAMPLE 14

(Preparation of a First Ceramic Sheet)

A first ceramic sheet was prepared in the same manner as in Example 12.

(Preparation of a Second Ceramic Sheet Having a Low Dielectric Constant)

To 50% by volume of a forsterite powder having an average particle size of 3 μm, there were added 50% by volume of a cordierite powder having an average particle size of 3 μm, 12% by mass of an acrylic binder as an organic resin for molding and toluene as a solvent. The mixture was mixed by using a ball mill for 24 hours to prepare a slurry thereof.

By using this slurry, a second ceramic sheet measuring 300 mm long, 300 mm wide and 230 μm thick and having a dielectric constant capacitance of as low as ∈=6 was prepared by the doctor blade method.

(Preparation of a Paste)

A paste for a third coating layer was prepared in the same manner as in Example 12.

(Preparation of a Composite Sheet)

A ceramic.ceramic composite sheet was prepared in nearly the same manner as in Example 12 but by using the above second ceramic sheet of a low dielectric constant instead of the metal sheet 2. By using the above ceramic-.ceramic composite sheet, a green laminate and a fired laminate (ceramic wiring board) were produced by press-laminating five layers of sheets in nearly the same manner as in Example 12.

The press-laminated green sample was observed for its deformation of the green sheet at the portion where the second ceramic sheet (low dielectric sheet) was buried. As a result, no deformation was recognized at all.

Further, the obtained fired laminate (ceramic wiring board) was measured for its flatness of the surface in the same manner as in Example 12 to find a maximum difference of height of 30 μm/10 mm. Thus, it was confirmed that there had been formed a highly flat board without almost any deformation.

Further, the portion of the low dielectric ceramic layer was cut, and the vicinity of the low dielectric ceramic layer 6 was observed through a binocular microscope to make sure that the layers had not been peeled and the defective filling had not occurred at all.

Further, a layer was plated on the surface of the wiring board, and a high-temperature/high-humidity bias testing was conducted to evaluate the reliability. After the testing, the junction interface was examined to make sure that no corrosion and the like took place.

Further, a heat shock testing was conducted to find that no crack or the like occurred in the interface of junction.

EXAMPLE 15

(Preparation of a First Ceramic Sheet)

A first sheet was prepared in the same manner as in Example 12.

(Preparation of a Second Ceramic Sheet Having a High Dielectric Constant)

To an aluminum oxide powder (average particle size of 1.8 μm) were added 5% by weight of $MnO_2$, 3% by weight of $SiO_2$, 0.5% by weight of MgO and 10% by weight of metal molybdenum, followed by the addition of 10% by weight of an acrylic binder as an organic resin for molding and toluene as a solvent. The mixture was mixed by using a ball mill for 24 hours to prepare a slurry thereof.

By using this slurry, a second sheet measuring 300 mm long, 300 mm wide and 230 μm thick and having a dielectric constant capacitance ∈=20 was prepared by the doctor blade method.

(Preparation of a Paste)

A paste for the third coating layer was prepared in the same manner as in Example 12.

(Preparation of a Composite Sheet)

A ceramic.ceramic composite sheet was prepared in nearly the same manner as in Example 14 but by using the above second ceramic sheet of a high dielectric constant instead of the above second ceramic sheet of a low dielectric constant. By using the above ceramic.ceramic composite sheet, a green laminate and a fired laminate (ceramic wiring board) were produced by press-laminating five layers of sheets in nearly the same manner as in Example 14.

The press-laminated green sample was observed for its deformation of the green sheet at the portion where the second ceramic sheet (high dielectric sheet) was buried. As a result, no deformation was recognized at all.

The obtained fired laminate (ceramic wiring board) was measured for its flatness of the surface in the same manner as in Example 12 to find a maximum difference of height of 30 μm/10 mm or less. Thus, it was confirmed that there had been formed a highly flat board without almost any deformation.

Further, the portion of the high dielectric ceramic layer was cut, and the vicinity of the high dielectric ceramic layer was observed through a binocular microscope to make sure that the layers had not been peeled and the defective filling had not occurred at all.

Further, a layer was plated on the surface of the wiring board, and a high-temperature/high-humidity bias testing was conducted to evaluate the reliability. After the testing, the junction interface was examined to make sure that no corrosion and the like took place.

Further, a heat shock testing was conducted to find that no crack or the like occurred in the interface of junction.

EXAMPLE 16

(Preparation of a First Glass Sheet)

To 60% by weight of a diopside-containing glass powder (average particle size of 1.8 μm) were added 30% by weight of alumina, 5% by weight of $SiO_2$ and 5% by weight of MgO, followed by the addition of 10% by weight of an acrylic binder as an organic resin for molding and toluene as a solvent. The mixture was mixed by using a ball mill for 24 hours to prepare a slurry thereof.

By using this slurry, a sheet measuring 300 mm long, 300 mm wide and 230 μm thick and having a dielectric constant capacitance ∈=9 was prepared by the doctor blade method.

Further, a metal paste was prepared by mixing 100% by volume of a copper powder having an average particle size of 3 μm, 5% by volume of a glass powder having an average particle diameter of 2 μm, 4% by mass of an acrylic binder as an organic resin for printing and 10% by mass of a dibutyl phthalate as a plasticizer, and was applied onto the surface of the above sheet in a predetermined pattern by the screen-printing method.

Further, through holes of a diameter of 120 μm were formed in the sheet by using a micro-drill and were filled with the above metal paste to form via conductors.

(Preparation of a Second Sheet of a Low Dielectric Constant)

To 40% by weight of a silica powder having an average particle size of 3 μm were added 30% by weight of a cordierite powder having an average particle size of 3 μm, 30% by weight of borosilicate glass powder, 10% by mass of an acrylic binder as an organic resin for molding and toluene as a solvent. The mixture was mixed by using a ball mill for 24 hours to prepare a slurry thereof.

By using this slurry, a second sheet measuring 300 mm long, 300 mm wide and 230 µm thick and having a dielectric constant capacitance ∈=5 was prepared by the doctor blade method.

(Preparation of a Paste)

It is desired that the coating layer is made of the same material as the first sheet. Therefore, the paste was prepared by mixing 60% by weight of a diopside-containing crystalline glass powder (average particle size of 1.8 µm), 30% by weight of alumina, 5% by weight of $SiO_2$ and 5% by weight of MgO, followed by the addition of 3% by weight of an acrylic binder as an organic resin for molding and acetone as a solvent. The mixture was mixed by using a ball mill for 24 hours to prepare a slurry thereof. Then, the solvent was volatilized to obtain a paste.

(Preparation of a Composite Member)

A through hole measuring 10 mm long and 30 mm wide was formed in the central portion of the first sheet 1 by using the punching device shown in FIG. 1.

Then, the second low dielectric sheet 2 was laminated on the first sheet 1 having the through hole, and the upper punch of the punching device was lowered until the lower surface of the upper punch was in flush with the surface of the first sheet 1.

The upper punch was raised, and it was confirmed that there had been formed a composite sheet A of a structure with the second low dielectric sheet 2 being buried in the through hole of the first sheet 1.

Then, the paste was printed on the interface of junction between the first sheet and the second low dielectric sheet to prepare a composite member A1 with a coating layer 10.

Next, a total of five layers of sheets were laminated by using an adhering solution, i.e., the composite sheet A1 prepared as described above, a composite sheet A2 prepared in the same manner as described above and in which the second low dielectric sheet has been buried in the through hole thereof, and the first sheets B1, B2 and B3 on which an ordinary wiring pattern has been formed.

In laminating the layers, the laminate was heated at a temperature of 60° C. under a pressure of 900 MPa.

The press-laminated sample was observed for its deformation of the sheets at the portion where the second low dielectric sheet was buried. However, no deformation of the sheets was recognized at all.

Next, the laminate was heated and sintered in a reducing atmosphere of 900° C. for 10 hours.

As a result, there was obtained a ceramic wiring board having a low dielectric layer in the portion where the low dielectric sheet has been buried.

The obtained ceramic wiring board was measured for its flatness of the surface of the low dielectric layer by the probing method to find a maximum difference of height of 30 µm/10 mm or less. Thus, it was confirmed that there had been formed a highly flat board without almost any deformation.

Further, the portion of the low dielectric ceramic layer was cut, and the vicinity of the low dielectric ceramic layer was observed through a binocular microscope to make sure that the layers had not been peeled and the defective filling had not occurred at all.

Further, a layer was plated on the surface of the wiring board, and a high-temperature/high-humidity bias testing was conducted to evaluate the reliability. After the testing, the junction interface was examined to make sure that no corrosion and the like took place.

Further, a heat shock testing was conducted to find that no crack or the like occurred in the interface of junction.

Comparative Example 4

A through hole was formed in the sheet A1 prepared in the same manner as in Example 12, but was not buried with the metal sheet. The sheets with the through hole were laminated on the surfaces on the one side only (sheets A1 and B1, and sheets A2 and B2) to form a recessed portion.

The recessed portion was filled with the metal paste described in Example 12 by the screen-printing method, and the sheets were dried at 60° C. for 60 minutes.

Five layers of sheets were laminated by using an adhering solution, i.e., the laminates of the sheets A1 and B1, and A2 and B2 together with the sheet B3 at a temperature of 60° C. under a pressure of 900 MPa.

The press-laminated sample was observed for its deformation at the portion filled with the metal paste. As a result, there was confirmed a dent in the surface of the metal paste.

Next, the laminate was heated in a reducing atmosphere of 1350° C. for 20 hours to effect the sintering. As a result, there was obtained a ceramic wiring board forming a metal layer.

The obtained ceramic wiring board was measured for its flatness of the surface of the metal layer by a probing method to find a maximum difference of height of 150 µm/10 mm. It was confirmed that there had been formed a poorly flat metal layer and the board had been deformed.

Further, the portion forming the metal layer was cut, and the vicinity of the metal layer was observed through a binocular microscope to find a gap formed in the interface between the insulating board and the metal layer probably due to defective filling.

What is claimed is:

1. A method of producing a composite sheet comprising:
   a step of preparing a first ceramic sheet from a ceramic powder, and a different kind of sheet made of a material different from that of the first ceramic sheet, both of said sheets having substantially the same thickness;
   a step of forming a through hole in a predetermined portion of said first ceramic sheet;
   a step of laminating said different kind of sheet on said first ceramic sheet in which said through hole is formed;
   a step of preparing a composite sheet by pressing the portion of said first ceramic sheet where the through hole is formed from the side of said different kind of sheet, such that a portion of said different kind of sheet is buried in the through hole in a manner that said first ceramic sheet and said different kind of sheet are integrated together; and
   a step of applying a paste onto the boundary portion between the first ceramic sheet and the different kind of sheet to form a coating layer on said portion, wherein said different kind of sheet is a burn-and-extinguish sheet made of a material that extinguishes by burning through the heat treatment.

2. A method of producing a composite sheet according to claim 1, wherein said burn-and-extinguish sheet contains resin beads having an average particle size of 1 to 20 µm.

3. A method of producing a composite sheet according to claim 1, wherein said burn-and-extinguish sheet is a carbon sheet made from a carbon powder.

4. A method of producing a composite sheet comprising:
   a step of preparing a first ceramic sheet from a ceramic powder, and a different kind of sheet made of a material different from that of the first ceramic sheet, both of said sheets having substantially the same thickness;

a step of forming a through hole in a predetermined portion of said first ceramic sheet;

a step of laminating said different kind of sheet on said first ceramic sheet in which said through hole is formed;

a step of preparing a composite sheet by pressing the portion of said first ceramic sheet where the through hole is formed from the side of said different kind of sheet, such that a portion of said different kind of sheet is buried in the through hole in a manner that said first ceramic sheet and said different kind of sheet are integrated together; and a step of applying a paste onto the boundary portion between the first ceramic sheet and the different kind of sheet to form a coating layer on said portion, wherein said different kind of sheet is a metal sheet made from a metal powder.

5. A method of producing a composite sheet according to claim 4, wherein the metal powder in said metal sheet contains a low-melting metal powder in an amount of 10 to 60% by volume and a high-melting metal powder in an amount of 40 to 90% by volume.

6. A method of producing a composite sheet comprising:
a step of preparing a first ceramic sheet and a different kind of sheet made of a material different from the first ceramic sheet, both of the sheets having substantially the same thickness;

a step of laminating said first ceramic sheet and said different kind of sheet one upon the other:

a step of preparing a composite sheet by pressing a predetermined portion of the laminate from the side of said different kind of sheet such that the pressed portion of said different kind of sheet is transferred onto the side of said first ceramic sheet to integrate said first ceramic sheet and said different kind of sheet together; and a step of applying a paste onto the boundary portion between the first ceramic sheet and the different kind of sheet to form a coating layer on said portion, wherein said different kind of sheet is a burn-and-extinguish sheet made of a material that extinguishes by burning through the heat treatment.

7. A method of producing a composite sheet according to claim 6, wherein said burn-and-extinguish sheet contains resin beads having an average particle size of 1 to 20 μm.

8. A method of producing a composite sheet according to claim 6, wherein said burn-and-extinguish sheet is a carbon sheet made from a carbon powder.

9. A method of producing a composite sheet comprising:
a step of preparing a first ceramic sheet and a different kind of sheet made of a material different from the first ceramic sheet, both of the sheets having substantially the same thickness;

a step of laminating said first ceramic sheet and said different kind of sheet one upon the other;

a step of preparing a composite sheet by pressing a predetermined portion of the laminate from the side of said different kind of sheet, such that the pressed portion of said different kind of sheet is transferred onto the side of said first ceramic sheet to integrate said first ceramic sheet and said different kind of sheet together; and a step of applying a paste onto the boundary portion between the first ceramic sheet and the different kind of sheet to form a coating layer on said portion, wherein said different kind of sheet is a metal sheet made from a metal powder.

10. A method of producing a composite sheet according to claim 9, wherein the metal powder in said metal sheet contains a low-melting metal powder in an amount of 10 to 60% by volume and a high-melting metal powder in an amount of 40 to 90% by volume.

11. A method of producing a composite sheet comprising:
a step of preparing a first ceramic sheet from a ceramic powder, and a different kind of sheet made of a material different from that of the first ceramic sheet, both of said sheets having substantially the same thickness;

a step of forming a through hole in a predetermined portion of said first ceramic sheet;

a step of laminating said different kind of sheet on said first ceramic sheet in which said through hole is formed;

a step of preparing a composite sheet by pressing the portion of said first ceramic sheet where the through hole is formed from the side of said different kind of sheet, such that a portion of said different kind of sheet is buried in the through hole in a manner that said first ceramic sheet and said different kind of sheet are integrated together, a step of swelling at least one of the first ceramic sheet or the different kind of sheet at a boundary portion thereof, and a step of pressing the composite sheet that has been swollen in the direction of thickness.

12. A method of producing a composite sheet comprising:
a step of preparing a first ceramic sheet and a different kind of sheet made of a material different from the first ceramic sheet, both of the sheets having substantially the same thickness;

a step of laminating said first ceramic sheet and said different kind of sheet one upon the other;

a step of preparing a composite sheet by pressing a predetermined portion of the laminate from the side of said different kind of sheet, such that the pressed portion of said different kind of sheet is transferred onto the side of said first ceramic sheet to integrate said first ceramic sheet and said different kind of sheet together, a step of swelling at least one of the first ceramic sheet or the different kind of sheet at a boundary portion thereof; and a step of pressing the composite sheet that has been swollen in the direction of thickness.

* * * * *